(12) United States Patent
Kwak et al.

(10) Patent No.: US 12,395,165 B2
(45) Date of Patent: Aug. 19, 2025

(54) APPARATUS AND METHODS TO CONTROL WELL BIAS IN A SEMICONDUCTOR DEVICE

(71) Applicant: Texas Instruments Incorporated, Dallas, TX (US)

(72) Inventors: Taewoo Kwak, McKinney, TX (US); Benjamin Amey, Allen, TX (US); Daijiro Otani, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 115 days.

(21) Appl. No.: 18/385,852

(22) Filed: Oct. 31, 2023

(65) Prior Publication Data

US 2025/0141443 A1    May 1, 2025

(51) Int. Cl.
*H03K 17/10* (2006.01)
*H03K 17/687* (2006.01)
*H03K 19/0185* (2006.01)

(52) U.S. Cl.
CPC ......... *H03K 17/102* (2013.01); *H03K 17/687* (2013.01); *H03K 19/018514* (2013.01); *H03K 2217/0063* (2013.01); *H03K 2217/0072* (2013.01)

(58) Field of Classification Search
CPC .................................................. H03K 17/102
USPC .......................................................... 327/108
See application file for complete search history.

(56) References Cited

U.S. PATENT DOCUMENTS

| | | | |
|---|---|---|---|
| 6,825,700 B2 * | 11/2004 | Hano | H10D 84/811 327/108 |
| 2013/0278301 A1 * | 10/2013 | Huynh | H01L 24/06 327/108 |
| 2022/0199611 A1 * | 6/2022 | Chen | H10D 84/0109 |

OTHER PUBLICATIONS

Waller, "Analog Layout—Wells, Taps, and Guard Rings," Pulsic, Feb. 18, 2021, retrieved from <https://pulsic.com/analog-layout-wells-taps-and-guard-rings/> on Sep. 20, 2023, 6 pages.

* cited by examiner

*Primary Examiner* — Tomi Skibinski
(74) *Attorney, Agent, or Firm* — Mandy Barsilai Fernandez; Frank D. Cimino

(57) ABSTRACT

An example circuit includes a substrate including a first transistor of a gate driver output stage, the substrate including a first well region; a diode circuit including a first terminal and a second terminal, the first terminal coupled to a first tap of the first well region; and a second transistor including a first terminal, a second terminal, and a body, the first terminal of the second transistor coupled to a switching voltage terminal, and the second terminal and the body of the second transistor coupled to the first tap of the first well region and to the first terminal of the diode circuit.

22 Claims, 19 Drawing Sheets

APPARATUS AND METHODS TO CONTROL WELL BIAS IN A SEMICONDUCTOR DEVICE

TECHNICAL FIELD

This description relates generally to circuits and, more particularly, to apparatus and methods to control well bias in a semiconductor device.

BACKGROUND

Electronic integrated circuit devices such as microchips that implement processors, logic devices, amplifiers, voltage converters, etc., are implemented using semiconductor materials. Semiconductor materials can be adapted to conduct electricity under various conditions to produce varying voltages and electrical currents according to different intended functions. An electronic integrated circuit device is a semiconductor device that includes multiple layers of semiconductor materials forming multiple electronic components such as transistors, capacitors, inductors, resistors, logic gates, etc. Predictable operation of such components facilitates implementing stable and intended functions of a semiconductor device such as numerical calculations, amplifications, filtering, etc. Different regions of a semiconductor device are designed to operate at corresponding voltage potentials and/or electrical current draws. To achieve stable and intended functionality of such a semiconductor device, its different regions are operated within their intended voltage potentials and/or electrical current draws.

Figure 1A:
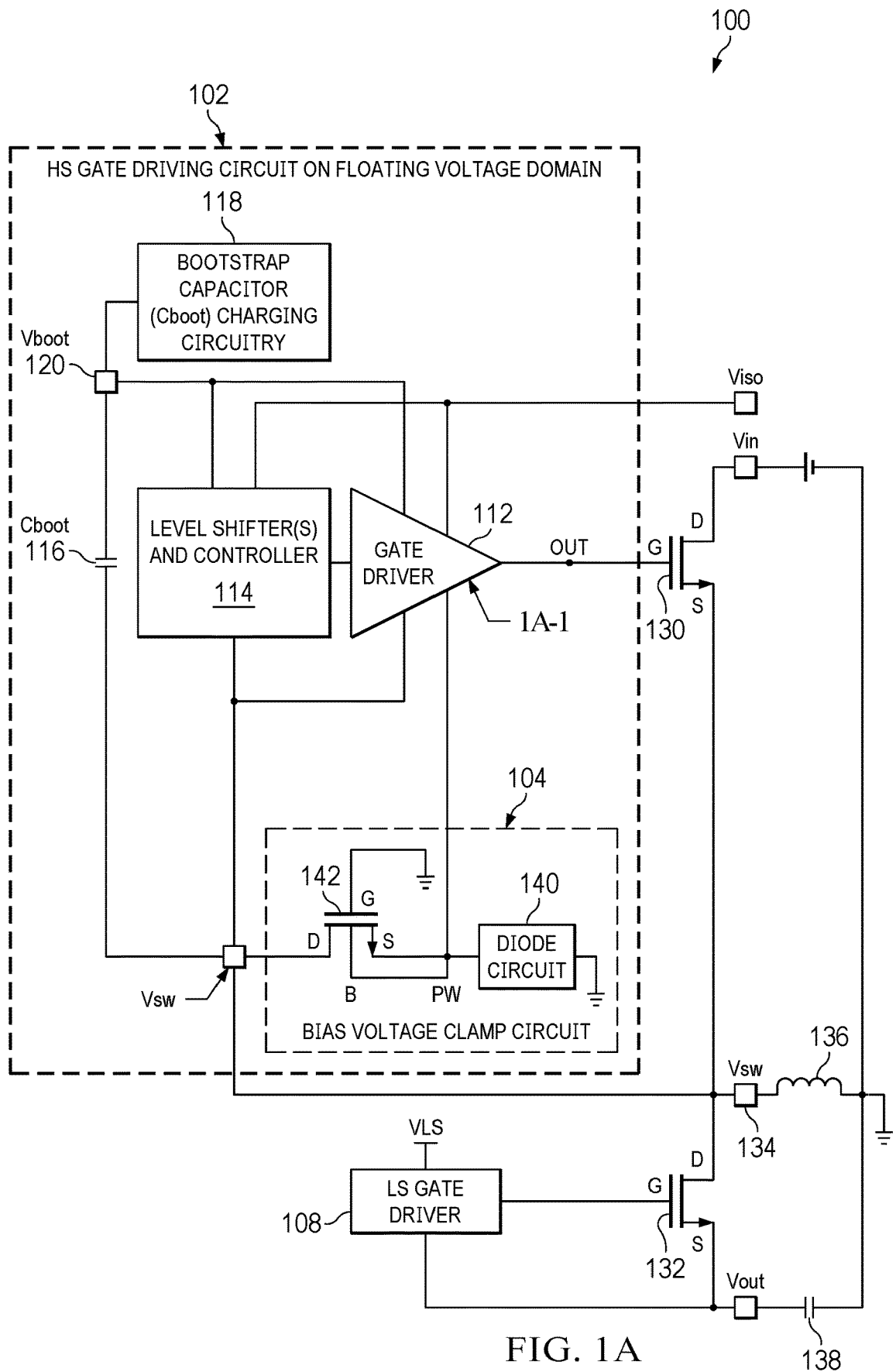
FIG. 1A (represented as FIG. 1A, FIG. 1A-1, FIG. 1A-2) is an example voltage converter circuit including a gate driving circuit and a well bias voltage clamp circuit to dynamically control well bias in a semiconductor device.

In general, the same reference numbers will be used throughout the drawings and accompanying written description to refer to the same or like parts. The figures are not necessarily to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular.

DETAILED DESCRIPTION

Latchup or p-n junction breakdown can be problematic for circuits that operate in a floating voltage domain such as high-side (HS) n-channel field effect transistor (NFET) gate driver circuits in inverting buck-boost voltage converters. In such circuits, biasing an N+ buried layer (NBL) by an external power source and operating its inner P-well (PW) as a switching voltage node (Vsw) creates a risk of latchup when the external power to NBL is shorted to ground (GND). Biasing the PW to a lowest voltage (e.g., −5.25V) is not always possible because when a bootstrapped voltage (Vboot) increases to ~10V, the voltage differential (e.g., 15.25V) violates an N-well (NW)-PW junction breakdown voltage limit of the corresponding semiconductor device. The NW-PW junction breakdown voltage limit is dependent on the semiconductor process (e.g., a ~12V process vs. a ~20V process) used to fabricate the semiconductor device.

Examples described herein include well bias voltage clamping circuits that control well bias voltage in p-type well regions and n-type well regions in semiconductor devices that operate in floating voltage domains. A floating voltage domain is a circuitry environment in which a voltage swings between two values (e.g., between low and high voltage values, between a negative voltage value and a positive voltage value, between ground and a negative voltage value, or between ground and a positive voltage value). In examples described herein, a p-type well region is also referred to as a P-well (PW) region, and an n-type well region is also referred to as an N-well (NW) region. In examples described herein, an NW region is a semiconductor layer that implements a body of a metal-oxide semiconductor (MOS) transistor (e.g., a p-channel MOS (PMOS)), and a PW region is another semiconductor layer surrounding the NW region of the MOS transistor to electrically isolate the MOS transistor from other NW regions in the semiconductor device. In examples described herein, another NW region is a N-type buried layer (NBL) region which isolates the PW region from a semiconductor substrate. Such electrical isolation prevents or decreases the likelihood of electron transfers (e.g., electrical current flow) between separate NW regions.

Undesired electron transfers (e.g., undesired electrical current flow) between separate regions in a semiconductor device can occur from unwanted p-n junction forward bias. If unwanted junction forward bias occurs, it can trigger a parasitic NPN transistor or a parasitic PNP transistor, which might result in latchup. In examples described herein, a p-n junction is a boundary between a p-type semiconductor material, such as a PW region, and an n-type semiconductor material, such as an NW region. Also, in examples described herein, an unwanted p-n junction forward bias refers to unwanted electron flow or unwanted electrical current flow between a p-type semiconductor material and an n-type semiconductor material. Such unwanted p-n junction forward biases lead to latchup in circuits. As used herein, latchup refers to an unpredictable operational state or a non-operational state of a circuit. Accordingly, during latchup, a circuit does not behave as expected and/or is rendered non-operational. Some instances of latchup can be resolved by re-starting or resetting the circuit. However, other instances of latchup are non-recoverable due to a permanent change or physical damage in a circuit.

To substantially reduce or eliminate unwanted p-n junction breakdowns and/or latchups in circuits, examples described herein include PW voltage clamping circuits to control well bias voltage in p-type well regions of semiconductor devices and NW voltage clamping circuits to control well bias voltage in n-type well regions of semiconductor devices. Example voltage clamping circuits described herein may be implemented using relatively little semiconductor area with only a negligible increase or substantially no increase in power consumption of a circuit.

As such, example voltage clamping circuits described herein are suitable for battery-powered devices due to the small footprint requirements and low to no increase in power consumption of the voltage clamping circuits. However, example voltage clamping circuits described herein are equally suitable for high-power devices such as devices that operate using external voltage supplies from an alternating-current (AC) source or direct-current (DC) source (e.g., wall power, plug-in power, automobile or vehicle power, etc.). In addition, example voltage clamping circuits described herein may be implemented using low-cost semiconductor manufacturing processes instead of needing to employ special semiconductor manufacturing processes that support high junction breakdown voltages and/or integrated back-gate p-channel field effect transistors (PFETs).

Figures 1, 1A:
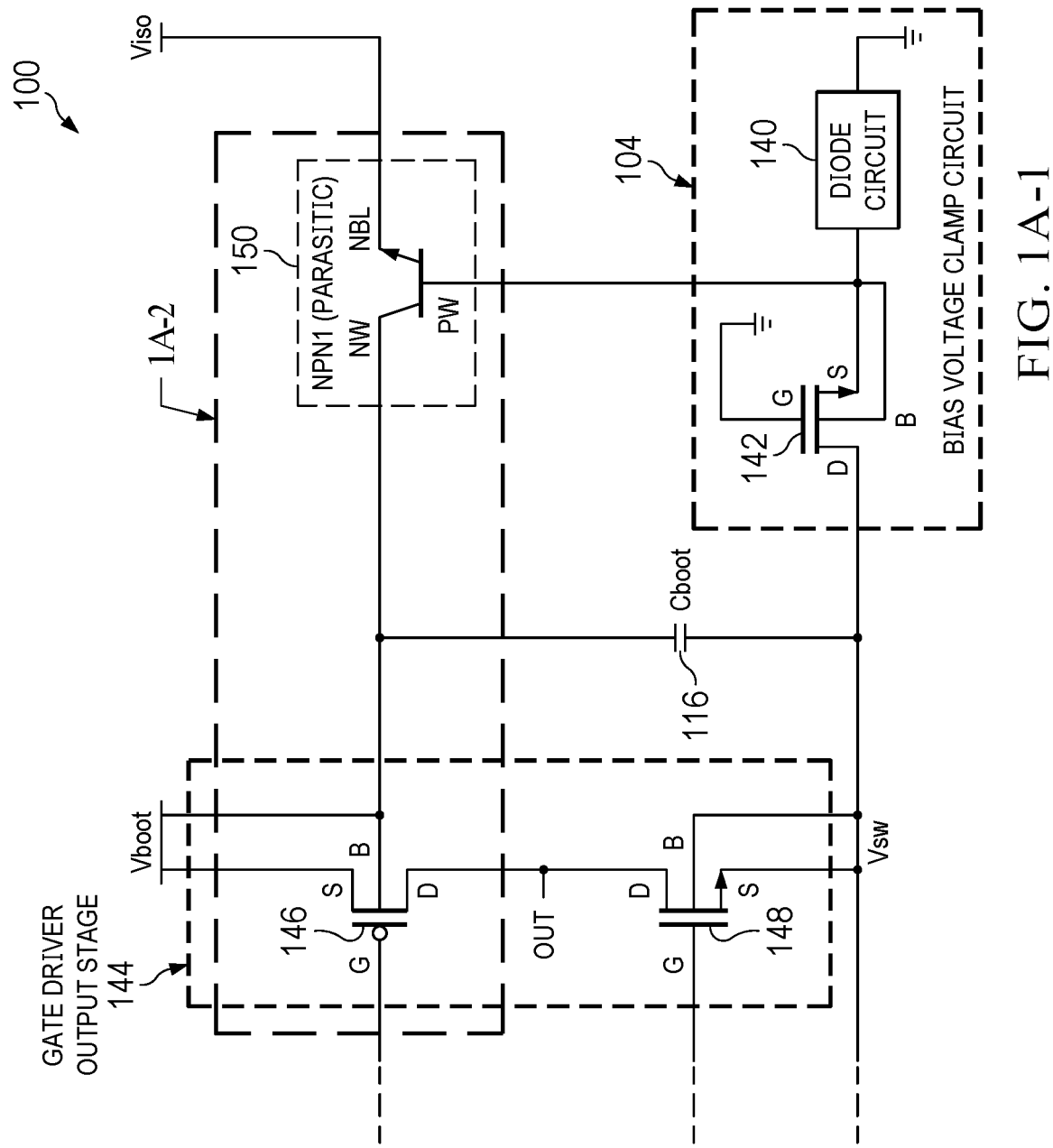

FIG. 1A (represented as FIG. 1A, FIG. 1A-1, FIG. 1A-2) is an example voltage converter circuit 100 including a gate driving circuit 102 and a P-well (PW) bias voltage clamp circuit 104 to dynamically control well bias in a semiconductor device 106. The voltage converter circuit 100 may be used to implement an inverting buck-boost (IBB) voltage converter and/or a single-input dual-output (SIDO) voltage converter. The gate driving circuit 102 of example FIG. 1A is a high-side (HS) gate driving circuit 102 that is in circuit with a low-side (LS) gate driving circuit 108.

Examples described herein are described in reference to implementing voltage clamp circuits in the high-side (HS) gate driving circuit 102. However, voltage clamp circuits described herein may be implemented in LS gate driving circuits and/or in any other circuit to control well bias in floating voltage domains. For example, examples described herein may be implemented in connection with any floating voltage domain circuits that require well bias voltage to follow a switching node voltage (Vsw) (or a bootstrapped voltage (Vboot)) to prevent latchup and/or junction breakdowns.

Examples described herein are not limited to high-side gate driver applications, inverting buck-boost voltage converters, or single-input dual-output voltage converters. Instead, examples described herein may be used in connection with any application having a well potential biased by a switching node voltage (or a bootstrapped voltage). Examples of such circuits include inductor-based switching converters such as buck voltage converters, boost voltage converters, charge pump circuits, etc.

In example FIG. 1A, the HS gate driving circuit 102 includes the PW voltage clamp circuit 104, gate driver circuitry 112, level shifter(s) and controller circuitry 114, a boot capacitor (Cboot) 116, and boot capacitor (Cboot) charging circuitry 118. An input of the gate driver circuitry 112 is connected to an output of the level shifter(s) and controller circuitry 114. Although shown as a single block, level shifter(s) may be implemented separate from a controller. An input signal to the level shifter(s) and controller circuitry 114 is in a different voltage domain (e.g., relative to ground). Since the floating gate driver circuitry 112 is referenced to a switching voltage (Vsw) which is switching between Vout (negative domain) and Vin (positive domain), the level shifter(s) of the level shifter(s) and controller circuitry 114 level shift the input signal (Vin) from ground to the switching voltage (Vsw).

The boot capacitor (Cboot) 116 is to assist in creating a floating voltage domain by holding charges to control a bootstrap voltage (Vboot). The boot capacitor (Cboot) 116 can be implemented inside or outside of a chip in which the voltage converter circuit 100 is located. The bootstrap capacitor charging circuitry 118 is to generate a bootstrap voltage (Vboot) by charging the boot capacitor (Cboot) 116. For example, since the switching voltage (Vsw) is switching between Vout and Vin, Vboot is also moving up and down with the voltage difference charged by the bootstrap capacitor (Cboot) 116.

The amount of voltage charged in the bootstrap capacitor (Cboot) 116 is controlled by the bootstrap capacitor charging circuitry 118. Accordingly, the bootstrap capacitor charging circuitry 118 regulates the voltage across the bootstrap capacitor (Cboot) 116. To achieve a small drain-source on resistance (RDS (on)) of a high-side (HS) power transistor 130, the gate-to-source voltage (Vgs) of the HS power transistor 130 is kept as high as possible within its voltage rating. For example, 5 volts can be stored across the bootstrap capacitor (Cboot) 116, and the bootstrap capacitor charging circuitry 118 can maintain a constant 5 volts while the switching voltage (Vsw) switches between Vout and Vin.

A bootstrap voltage (Vboot) output of the bootstrap capacitor charging circuitry 118 is connected to the boot capacitor (Cboot) 116, the level shifter(s) and controller circuitry 114, and the gate driver circuitry 112 via a bootstrap voltage terminal (120). In the illustrated example of FIG. 1A, the bootstrap voltage (Vboot) is generated internally in a same chip in which the voltage converter circuit 100 is located. However, it can be generated externally from the chip using, for example, a Schottky diode. If generated externally from the chip of the voltage converter circuit 100, the bootstrap capacitor charging circuitry 118 is to control the application of the externally generated bootstrap voltage (Vboot) to charge the boot capacitor (Cboot) 116.

In example FIG. 1A, the voltage converter circuit 100 includes the high-side (HS) power transistor 130 including a drain (D) terminal, a source(S) terminal, and a gate (G) terminal. The voltage converter circuit 100 also includes a low-side (LS) power transistor 132 including a drain (D) terminal, a source(S) terminal, and a gate (G) terminal, also referred to as a drain, source, and gate. In examples described herein, a power transistor is to control high current-voltage ratings (e.g., high current-voltage ratings that exceed current-voltage ratings of small-current transistors). For example, relative to a small-current transistor, a power transistor has a larger current rating, a larger power dissipation rating, and a larger size to satisfy heat dissipation demands of its high current-voltage rating. In the illustrated example, the power transistors 130, 132 are implemented inside a same chip that includes the voltage converter circuit 100. However, in other examples, the power transistors 130, 132 is located outside of the chip. The drain (D) terminal of the LS power transistor 132 is coupled to the source terminal of the HS power transistor 130 and to a switching voltage (Vsw) terminal 134 which is connected to ground via an inductor 136. In the illustrated example, the inductor 136 is located outside of a chip that includes the voltage converter circuit 100. However, in other examples, the inductor 136 is located inside of the chip.

An output (OUT) terminal of the gate driver circuitry 112 is connected to the gate (G) terminal of the HS power transistor 130. An output terminal of the LS gate driving circuit 108 is coupled to the gate (G) terminal of the LS power transistor 132. The drain (D) terminal of the HS power transistor 130 is coupled to an input voltage (Vin) terminal. The source(S) terminal of the LS power transistor 132 is coupled to an output voltage (Vout) terminal which is connected to ground via a capacitor 138. The gate driver circuitry 112 is to control on/off states of the HS power transistor 130 based on input signals to the gate driver circuitry 112. As such, the HS gate driving circuit 102 can be used in inverting buck-boost (IBB) converters. In IBB converters, inverting is performed by generating negative output voltages. Considering the absolute voltage of the output (Vout), to buck is to decrease an output voltage (Vout) to be smaller than the input voltage (Vin) and to boost is to increase the output voltage (Vout) to be greater than the input voltage (Vin).

The PW voltage clamp circuit 104 includes a diode circuit 140 and a clamp transistor 142. In examples described herein, the clamp transistor 142 is shown as an NMOS transistor. However, example voltage clamp circuits described herein may be adapted to include a PMOS transistor in place of the NMOS transistor to bias well regions of semiconductor devices in teachings of this description. In example FIG. 1A, the clamp transistor 142 includes drain (D) terminal, a source(S) terminal, a gate (G) terminal, and a body (B). The drain (D) terminal of the clamp transistor 142 is connected to the level shifter(s) and control circuitry 114. The drain (D) terminal of the clamp transistor 142 is also connected to a terminal of the bootstrap capacitor (Cboot) 116 opposite the terminal of the bootstrap capacitor (Cboot) 116 that is connected to the bootstrap voltage (Vboot) terminal and the bootstrap capacitor charging circuitry 118. In addition, the source(S) terminal and the body (B) of the clamp transistor 142 are coupled to the gate driver circuitry 112 and to a first terminal of the diode circuit 140. The gate (G) terminal of the clamp transistor 142 and a second terminal of the diode circuit 140 are connected to ground.

The diode circuit 140 is shown in block form in FIG. 1A to represent that it may be implemented using any suitable circuit configuration to create a diode-like operation. For example, as shown in FIGS. 5, 7, 9, and 11, the diode circuit 140 may be implemented using a diode component. In alternative examples shown in FIGS. 6, 8, 10, and 12, the diode circuit 140 may be implemented using a diode-connected transistor. When implemented as a diode component, the terminals of the diode circuit 140 include anode and cathode terminals. When implemented as a diode-connected transistor, the terminals of the diode circuit 140 include a source terminal and a drain terminal. Connection configurations for the different examples are described below in connection with FIGS. 5-12.

An example transistor-level circuit view of an example gate driver output stage 144 is shown in detail in FIG. 1A. The gate driver output stage 144 is a final stage of the gate driver circuitry 112 through which the gate driver circuitry 112 provides an output voltage to the HS power transistor 130 via an output (OUT) terminal. The gate driver output stage 144 includes an example bootstrap voltage (Vboot) transistor 146 and an example switching voltage (Vsw) transistor 148. The labels of Vboot and Vsw for the Vboot transistor 146 and the Vsw transistor 148 are used merely for ease of reference and are based on the Vboot transistor 146 being connected to a bootstrap voltage (Vboot) terminal and the Vsw transistor 148 being connected to a switching voltage (Vsw) terminal.

In example FIG. 1A, the Vboot transistor 146 is implemented using a PMOS transistor, and the Vsw transistor 148 is implemented using an NMOS transistor. However, in alternative implementations, the Vboot transistor 146 may be implemented using an NMOS transistor and/or the Vsw transistor 148 may be implemented using a PMOS transistor as suitable for different voltage conversion applications.

In FIG. 1A, a source(S) terminal and a body (B) of the Vboot transistor 146 are connected to the bootstrap voltage (Vboot) terminal. A source(S) terminal and a body (B) of the Vsw transistor 148 are connected to the switching voltage (Vsw) terminal. A drain (D) terminal of the Vboot transistor 146 is connected to a drain (D) terminal of the Vsw transistor 148, forming the output (OUT) terminal of the gate driver output stage 144. A first terminal of the bootstrap capacitor (Cboot) 116 is connected to the body (B) of the Vboot transistor 146. A second terminal of the bootstrap capacitor (Cboot) 116 is connected to the drain (D) terminal of the clamp transistor 142 and the switching voltage (Vsw) terminal.

In the example transistor-level circuit view of the gate driver output stage 144, the gate driver output stage 144 is shown connected to a parasitic NPN transistor 150 (e.g., labeled NPN1 in FIG. 1A). An NPN transistor is formed by a P-type doped semiconductor (e.g., the PW region 154)

between two N-type doped semiconductors (e.g., (1) the NW region 152 and (2) the NBL region 156). The parasitic NPN transistor 150 is not an actual transistor designed into the circuit. Instead, the symbol of the parasitic NPN transistor 150 connected to the gate driver output stage 144 represents an unintended electrical effect or behavior resulting from the arrangement of different semiconductor materials in a P-well (PW) layer (e.g., the PW region 154) and an N-well (NW) layer (e.g., the NW region 152) of the semiconductor device 106, as described below.

A collector terminal of the parasitic NPN transistor 150 is designated NW for N-well region (e.g., an NW region 152 described below) and is connected to the body (B) of the Vboot transistor 146 and to a terminal of the boot strap capacitor (Cboot) 116. A base terminal of the parasitic NPN transistor 150 is designated PW for P-well region (e.g., a PW region 154 described below) and is connected to the source (S) terminal and the body (B) of the clamp transistor 142 and a terminal of the diode circuit 140 of the PW voltage clamp circuit 104. An emitter terminal of the parasitic NPN transistor 150 is designated NBL for N-type buried layer (e.g., an NBL region 156 described below) and is connected to an isolation voltage (Viso) terminal.

A detailed multi-layer view of the semiconductor device 106 in FIG. 1A corresponds to the Vboot transistor 146 and the parasitic NPN transistor 150. As shown in the detailed multi-layer view of the semiconductor device 106, the semiconductor device 106 includes an example NW region 152, an example PW region 154, an example N-type buried layer (NBL) region 156, and an example substrate (PSUB) 158. In the illustrated example, the NW region 152 abuts the PW region 154, the PW region 154 is between the NW region 152 and the NBL region 156, and the NBL region 156 is between the PW region 154 and the substrate (PSUB) 158.

In the illustrated example, the NW region 152 includes an N-type semiconductor material. An N-type semiconductor material is made by doping a pure semiconductor with one or more impurities so that the majority of charge carriers in the resulting N-type semiconductor material are free electrons and holes are the minority. The PW region 154 includes a P-type semiconductor material. A P-type semiconductor material is made by doping a pure semiconductor with one or more impurities so that the majority of charge carriers in the resulting P-type semiconductor material are holes and free electrons are the minority.

The NBL region 156 is an isolation (ISO) region or layer that operates as another NW region to electrically isolate the PW region 154 from other P-type regions. The substrate (PSUB) region 158 is implemented as a P-minus substrate on which the NBL region 156, the PW region 154, and the NW region 152 are formed. The NBL region 156 is connected to an isolation voltage (Viso) supply 160 by way of a through-via 162 that is formed through the PW region 154 between a N+ tap and the NBL region 156. Although the NW region 152, the PW region 154, the NBL region 156, and the substrate (PSUB) region 158 are referred to as regions, these features of the semiconductor 106 may also or alternatively be referred to as layers. For example, each of the regions 152, 154, 156, 158 is formed as a layer in the semiconductor 106 during a semiconductor fabrication process.

As shown in the detailed multi-layer view of the semiconductor device 106, the Vboot transistor 146 is formed in the NW region 152. The parasitic NPN transistor 150 is an NPN transistor effect created by the proximities of the NW region 152, the PW region 154, and the NBL region 156 to one another. The collector terminal of the parasitic NPN transistor 150 is formed by the NW region 152. A base terminal of the parasitic NPN transistor 150 is formed by the PW region 154. An emitter terminal of the parasitic NPN transistor 150 is formed by the NBL region 156 and its through-via 162 that connects to an isolation voltage (Viso) terminal via an N+ tap.

The semiconductor device 106 also includes a parasitic PNP transistor 166 (e.g., labeled PNP1 in FIG. 1A) that is not an actual transistor designed into the circuit. However, its symbol connected to the Vboot transistor 146 represents an unintended electrical effect or behavior resulting from the arrangement of different semiconductor materials in the PW region 154 and the NW region 152 of the semiconductor device 106. Accordingly, the parasitic PNP transistor 166 is a PNP transistor effect created by the proximities of the NW region 152 and the PW region 154 to one another. A PNP transistor is formed by an N-type doped semiconductor (e.g., the NW region 152) between two P-type doped semiconductors (e.g., (1) the source(S) terminal of the Vboot transistor 146 and (2) the PW region 154). A drawback of the parasitic NPN transistor 150 and the parasitic PNP transistor 166 is that their switch-on voltages could be unintentionally satisfied by unintended voltage differences between the NW region 152, the PW region 154, and the NBL region 156. This, in turn, creates an undesired p-n junction forward bias causing latchup between two or more of these regions 152, 154, 156.

Figures 1, 1A, 2:
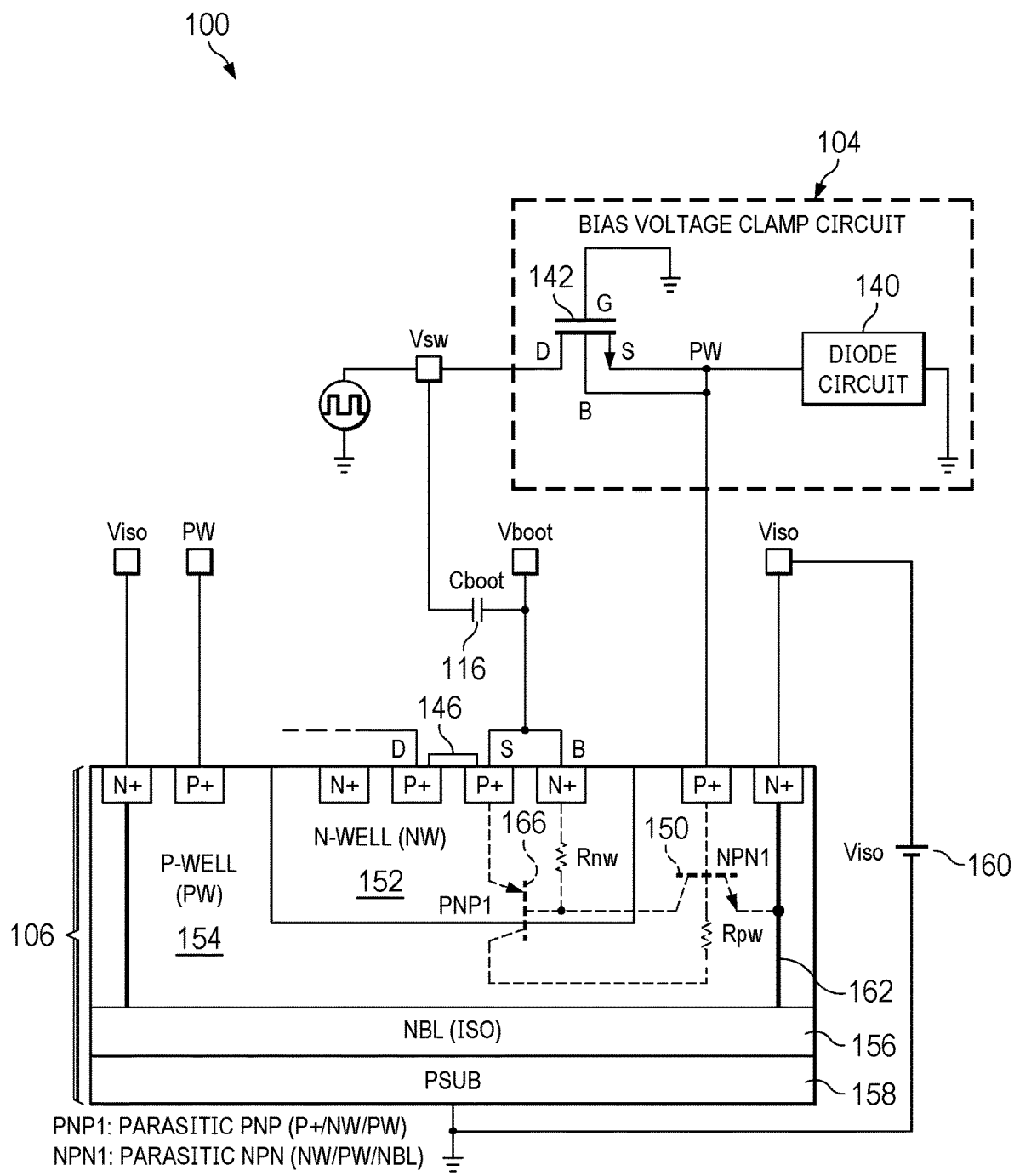
FIG. 2 shows example waveforms of different node voltages associated with the voltage clamp circuit and the semiconductor of FIGS. 1A and 1B.

For example, normally the isolation voltage (Viso) supply 160 is held at a sufficiently high voltage to prevent satisfying the switch-on voltages of the parasitic NPN transistor 150 and the parasitic PNP transistor 166. Referring briefly to FIG. 2, which shows example waveforms of different node voltages associated with the semiconductor device 106, an example isolation voltage (Viso) waveform 202 maintains a voltage level greater than a voltage level of a switching voltage (Vsw) waveform 204. However, if the isolation voltage (Viso) 160 is shorted to ground, moving the isolation voltage (Viso) waveform 202 to ground (e.g., 0V) in FIG. 2, and the switching voltage (Vsw) transitions to a maximum voltage as shown by the switching voltage (Vsw) waveform 204, the switching voltage (Vsw) becomes greater than the isolation voltage (Viso) supply 160. This voltage difference satisfies the switch-on voltage of the parasitic NPN transistor 150, which causes the parasitic NPN transistor 150 to turn on. This creates an electrical voltage drop (IR drop) across a parasitic resistor Rnw which causes the parasitic PNP transistor 166 to also turn on. In turn, an undesirable p-n junction tunnel is created between the NW region 152 and the PW region 154.

Examples described herein implement the PW voltage clamp circuit 104 to substantially prevent or reduce the likelihood of the switching voltage (Vsw) exceeding the isolation voltage (Viso) supply 160. For example, as shown in FIG. 2 by voltage wave form PW 206, the PW voltage clamp circuit 104 clamps the switching voltage (Vsw) to the PW region 154 at a voltage clamp level shown as ground (e.g., 0 V). Using the PW voltage clamp circuit 104 to clamp or limit the voltage to the PW region 154 to ground (as shown by the voltage wave form PW 206) prevents switching on the parasitic NPN transistor 150 and the parasitic PNP transistor 166 (e.g., prevents the parasitic transistors 150, 166 from being forward biased). For example, the parasitic transistors 150, 166 are not switched on even if the isolation voltage (Viso) supply 160 is shorted to ground (moving the isolation voltage (Viso) waveform 202 to ground (e.g., 0V)

in FIG. 2) while the switching voltage (Vsw) transitions to a maximum voltage as shown by the switching voltage (Vsw) waveform 204.

Figure 1B:
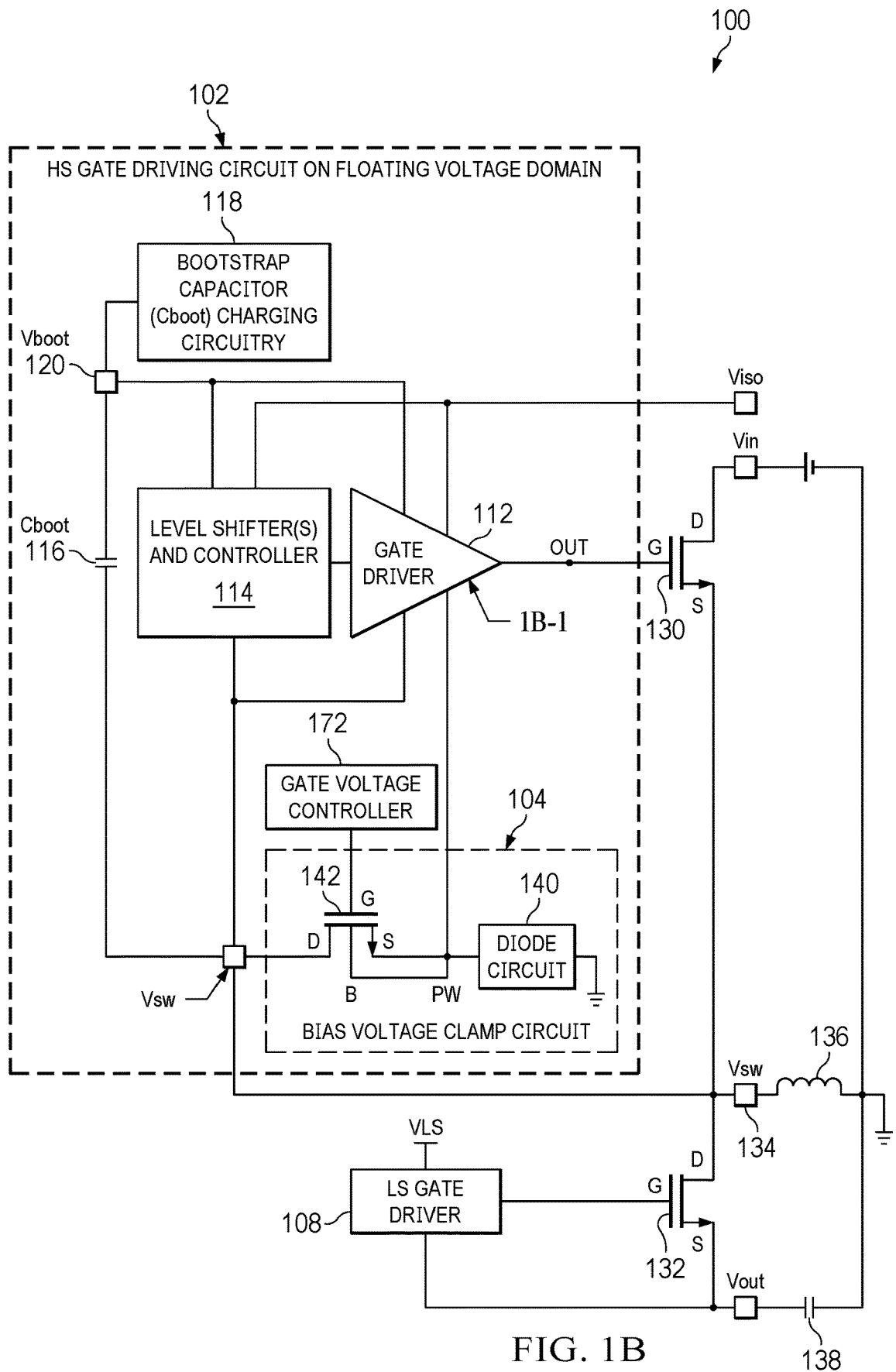
FIG. 1B (represented as FIG. 1B, FIG. 1B-1, FIG. 1B-2) is the example voltage converter circuit of FIG. 1A including a gate voltage controller connected to the well bias voltage clamp circuit of FIG. 1A.
Figures 1, 1B:
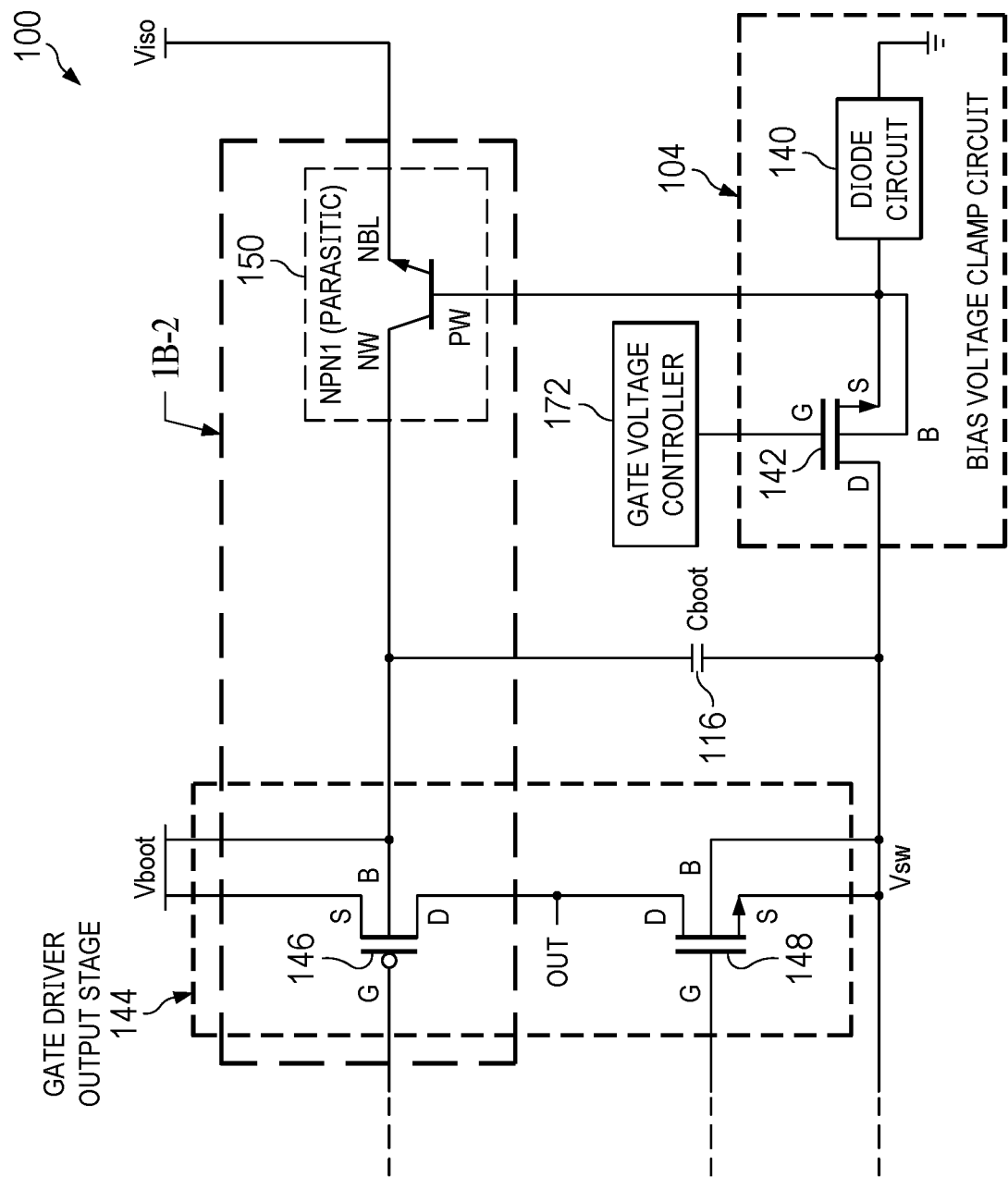
Figures 1, 1B, 2:
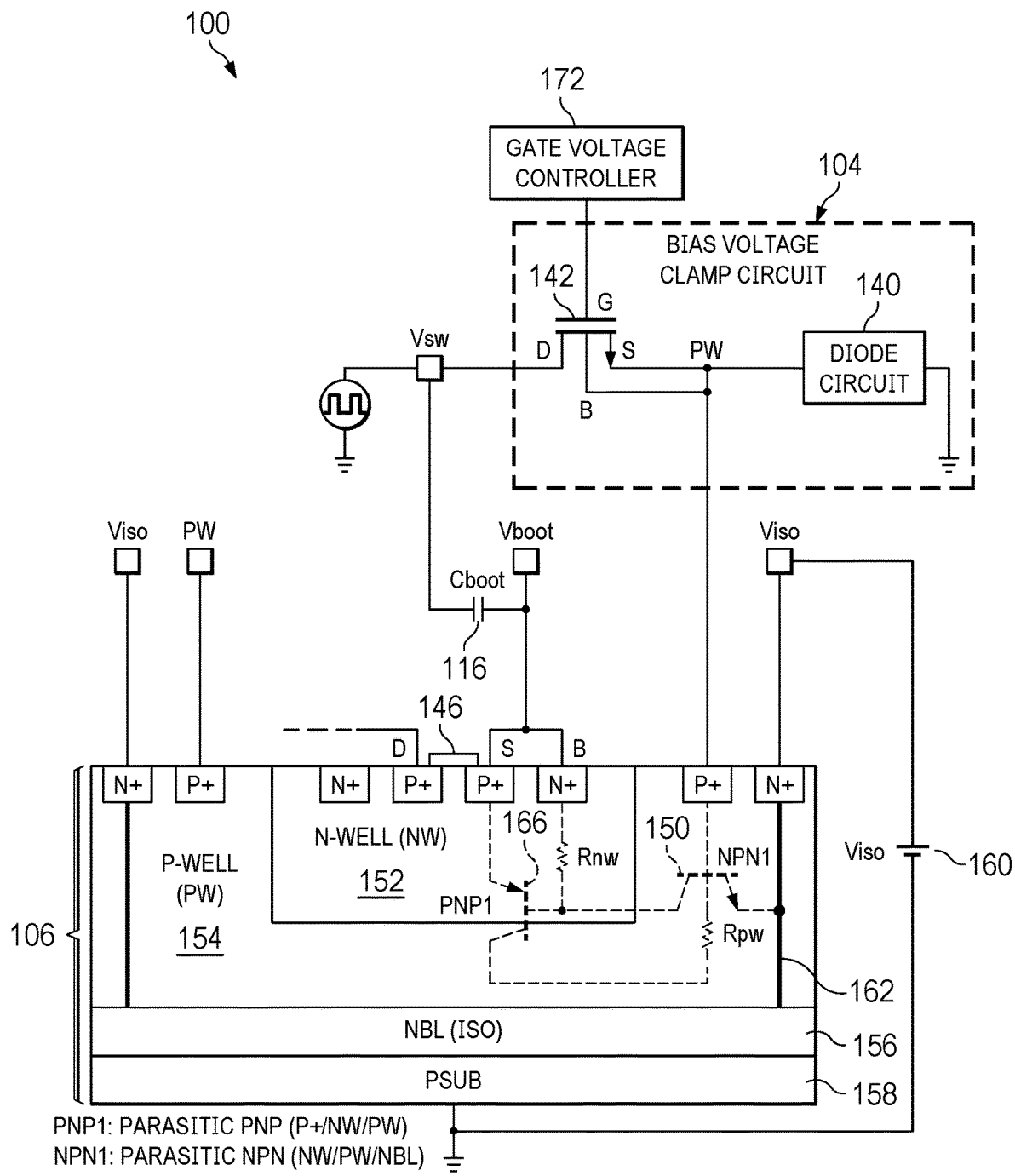
Figure 2:
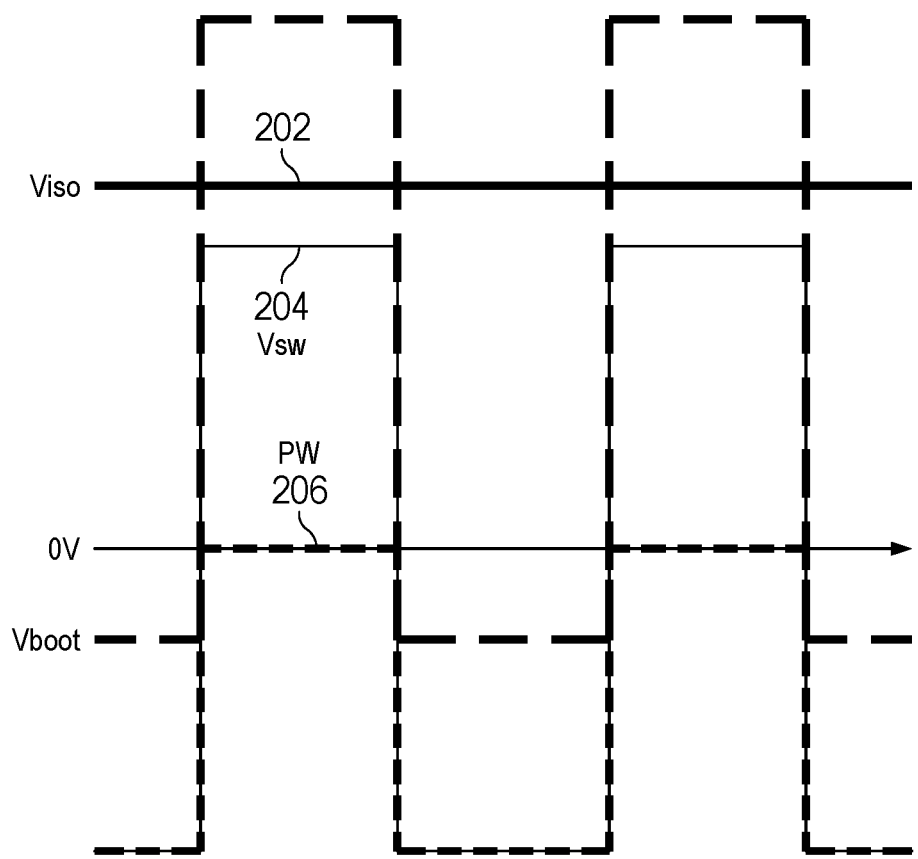

FIG. 1B (represented as FIG. 1B, FIG. 1B-1, FIG. 1B-2) is the example voltage converter circuit 100 of FIG. 1A including a gate voltage controller 172 connected to the PW voltage clamp circuit 104 of FIG. 1A. As shown in FIG. 1B, the gate voltage controller 172 is connected to a gate (G) terminal of the clamp transistor 142. The gate voltage controller 172 enables dynamically controlling a voltage range of the PW voltage clamp circuit 104. For example, the gate voltage controller 172 can be used to control a gate voltage of the gate terminal of the clamp transistor 142 to accommodate more negative output voltages for a PW voltage bias of the PW region 154 and more positive output voltages for an NW voltage bias of the NW region 152. An example circuit that may be used to implement the gate voltage controller 172 is described below in connection with FIGS. 7, 8, 11, and 12.

Figure 3A:
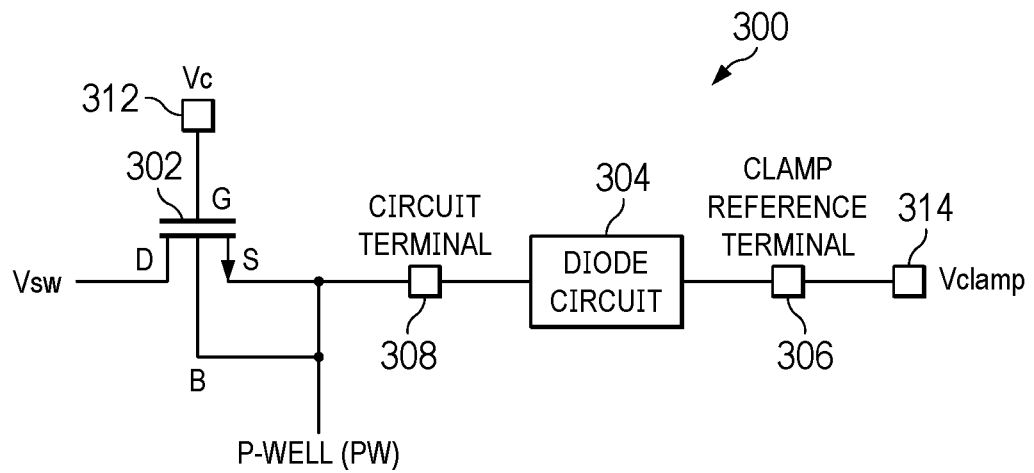
FIG. 3A is an example P-well (PW) voltage clamp circuit to control well bias voltage in a p-type well region of a semiconductor device.

FIG. 3A is an example P-well (PW) voltage clamp circuit 300 to control well bias voltage in the PW region 154 of the semiconductor device 106 of FIGS. 1A and 1B. The PW voltage clamp circuit 300 may be used to implement the PW voltage clamp circuit 104 of FIGS. 1A and 1B. The PW voltage clamp circuit 300 includes a clamp transistor 302 and a diode circuit 304. The clamp transistor 302 is an NFET transistor and implements the clamp transistor 142 of FIGS. 1A and 1B. The diode circuit 304 implements the diode circuit 140 of FIGS. 1A and 1B.

The clamp transistor 302 includes a drain (D) terminal, a gate (G) terminal, a source(S) terminal, and a body. The diode circuit 304 includes a clamp reference terminal 306 and a circuit terminal 308. In the clamp transistor 302, the drain (D) terminal is connected to a switching voltage (Vsw) terminal. The gate (G) terminal is connected to a clamp voltage control (Vc) terminal 312, and the source(S) terminal and the body are connected to the circuit terminal 308 of the diode circuit 304. The clamp reference terminal 306 of the diode circuit 304 is connected to a well bias voltage clamp (Vclamp) terminal 314.

The voltage at the well bias voltage clamp (Vclamp) terminal 314 represents the clamp level of the well bias voltage in the PW region 154 (FIGS. 1A and 1B). The voltage at the clamp voltage control (Vc) terminal 312 is approximately equal to the voltage at the well bias voltage clamp (Vclamp) terminal 314. The PW bias voltage (e.g., the PW bias voltage waveform 320 of FIG. 3B) follows the switching voltage (Vsw) responsive to the clamp transistor 302 turning on when the switching voltage (Vsw) is below the clamp voltage (Vc) minus the threshold voltage of the clamp transistor 302 (Vc−Vth).

To prevent the diode circuit 304 from turning on and electrical current flowing into the well bias voltage clamp (Vclamp) terminal 314 through the diode circuit 304 while the clamp transistor 302 is turned on, the voltage at the well bias voltage clamp (Vclamp) terminal 314 is not to be smaller than the clamp voltage (Vc) minus the threshold voltage of the clamp transistor 302 minus one diode voltage drop (e.g., Vc−Vth−one diode voltage drop). Responsive to the switching voltage (Vsw) increasing above the clamp voltage (Vc) minus the threshold voltage of the clamp transistor 302 (Vc−Vth), the clamp transistor 302 turns off and the PW bias voltage (e.g., the PW bias voltage waveform 320) enters into a floating state. In such instances, the voltage at the voltage clamp (Vclamp) terminal 314 keeps the PW bias voltage (e.g., the PW bias voltage waveform 320) from increasing above Vclamp plus one diode voltage drop (e.g., the bias clamp voltage level 322 of FIG. 3B).

The clamp voltage (Vc) is determined by considering the gate-to-source voltage (Vgs) breakdown voltage of the clamp transistor 302. Responsive to the switching voltage (Vsw) becoming the most negative voltage, the PW bias voltage (e.g., the PW bias voltage waveform 320) becomes equal to the switching voltage (Vsw) and Vgs=(Vc−PW)= (Vc−Vsw). Since there is a voltage rating for the Vgs of the clamp transistor 302, Vc−Vsw is not to exceed that rating.

Figure 3B:
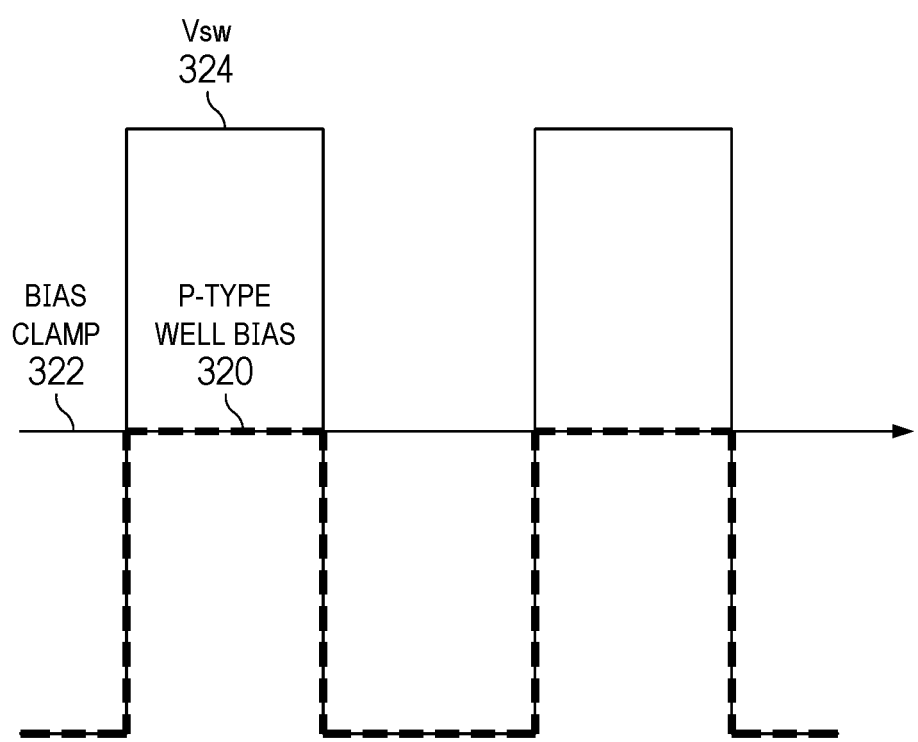
FIG. 3B is an example waveform of voltage clamping generated by the PW voltage clamp circuit of FIG. 3A to control a p-type well bias.

FIG. 3B is an example PW bias voltage waveform 320 of voltage clamping generated by the PW voltage clamp circuit 300 of FIG. 3A to control a p-type well bias in, for example, the PW region 154 (FIGS. 1A and 1B). The PW bias voltage waveform 320 shows how setting the voltage at the clamp voltage control (Vc) terminal 312 of FIG. 3A for the PW voltage clamp circuit 300 causes the well bias voltage at the PW region 154 to remain below a bias clamp voltage level 322 and be clamped or limited to the bias clamp voltage level 322, even when the voltage level of a switching voltage (Vsw) 324 exceeds the bias clamp voltage level 322.

For example, responsive to the Vsw voltage level 324 decreases to a voltage below the bias clamp voltage level 322, the voltage at the drain (D) terminal of the clamp transistor 302 decreases causing the clamp transistor 302 to switch to an on state to generate a voltage bias below the bias clamp voltage level 322 in a PW region (e.g., the PW region 154 of FIGS. 1A and 1B). Since the clamp transistor 302 is switched to an on state, the PW voltage clamp circuit 300 allows the well bias voltage in the PW region 154 to follow the Vsw voltage level 324 below the bias clamp voltage level 322 as shown by the PW bias voltage waveform 320. However, responsive to the Vsw voltage level 324 increasing to a voltage above the bias clamp voltage level 322, the diode circuit 304 of the PW voltage clamp circuit 300 clamps the well bias voltage of the PW region 154 at or approximately at the bias clamp voltage level 322. This is based on the clamp transistor 302 turning off after the Vsw voltage level 324 increases at the drain (D) terminal of the clamp transistor 302 above the bias clamp voltage level 322 and toward a highest voltage (e.g., toward a positive voltage if the Vc terminal 312 and the Vclamp terminal 314 are tied to ground).

In this manner, the PW voltage clamp circuit 300 can be used to limit or clamp the well bias voltage for the PW region 154. This prevents or substantially reduces the likelihood of switching on the parasitic NPN transistor 150 and the parasitic PNP transistor 166 (FIG. 1A), even if an isolation voltage (Viso) (e.g., the Viso supply 160 of FIG. 1A) is shorted to ground. In some examples, the clamping of the well bias voltage is approximated to be at the bias clamp voltage level 322 offset by a threshold voltage (Vth) of a transistor and/or offset by a forward drop voltage of a diode due to transistor and/or diode characteristics of the PW voltage clamp circuit 300.

In examples described herein, to control the amount of well bias voltage in the PW region 154, the voltage at the clamp voltage control (Vc) terminal 312 can be set to any suitable (e.g., selected or target) voltage as long as the voltage at the well bias voltage clamp (Vclamp) terminal 314 is not smaller than the clamp voltage (Vc) minus the threshold voltage of the clamp transistor 302 minus one diode voltage drop (e.g., Vc−Vth−one diode voltage drop). In some examples, the voltage at the clamp voltage control (Vc) terminal 312 can be statically set for the PW voltage clamp circuit 300 by connecting the clamp voltage control (Vc) terminal 312 to a fixed voltage level to limit or clamp the well bias voltage at the PW region 154 to a fixed maximum level. For example, the clamp voltage control (Vc) terminal 312 is connected to ground so that the maximum well bias voltage is ground (e.g., 0V). Alternatively, the clamp voltage control (Vc) terminal 312 may be connected to any other suitable fixed voltage level to limit or clamp the well bias voltage generated by the PW voltage clamp circuit 300 at that voltage level. In other examples, the voltage at the clamp voltage control (Vc) terminal 312 is dynamically changed by connecting the clamp voltage control (Vc) terminal 312 to a gate voltage controller such as the gate voltage controller 172 of FIG. 1B. In such examples, the maximum well bias voltage generated by the PW voltage clamp circuit 300 is controlled by the gate voltage controller.

Figure 4A:
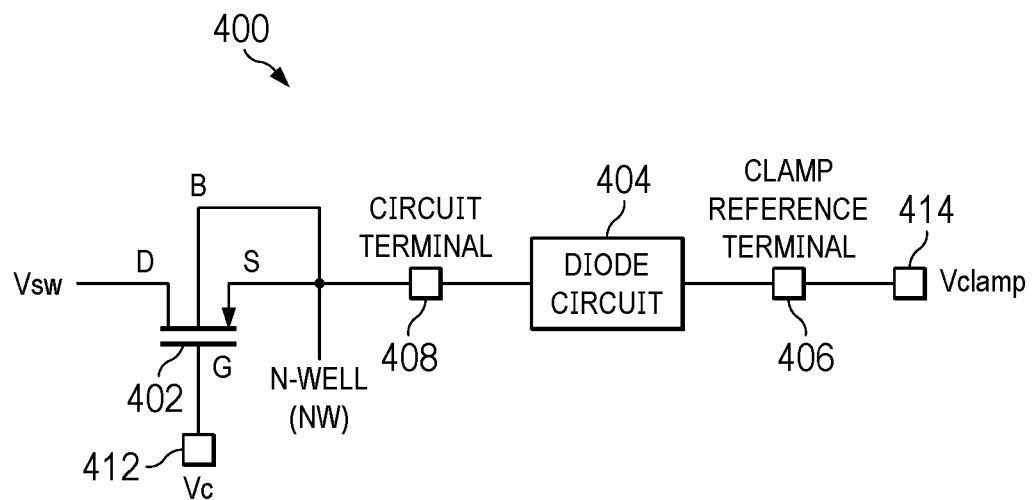
FIG. 4A is an example N-well (NW) voltage clamp circuit to control well bias voltage in an n-type well region of a semiconductor device.

FIG. 4A is an example N-well (NW) voltage clamp circuit 400 to control well bias voltage in the NW region 152 of the semiconductor device 106 of FIGS. 1A and 1B. For example, the NW voltage clamp circuit 400 replaces the PW voltage clamp circuit 104 in the example circuits of FIGS. 1A and 1B as described below in connection with FIGS. 9-12 to control a well bias voltage in the NW region 152 and/or the NBL region 156, which is also an NW region. The NW voltage clamp circuit 400 includes a clamp transistor 402 and a diode circuit 404. The clamp transistor 402 is a PFET transistor. The clamp transistor 402 includes a drain (D) terminal, a gate (G) terminal, a source(S) terminal, and a body. The diode circuit 404 includes a clamp reference terminal 406 and a circuit terminal 408. In the clamp transistor 402, the drain (D) terminal is connected to a switching voltage (Vsw) terminal. The gate (G) terminal is connected to a clamp voltage control (Vc) terminal 412, and the source(S) terminal and the body are connected to the circuit terminal 408 of the diode circuit 404. The clamp reference terminal 406 of the diode circuit 404 is connected to a well bias voltage clamp (Vclamp) terminal 414.

The voltage at the well bias voltage clamp (Vclamp) terminal 414 represents the clamp level of the well bias voltage in the NW region 152. The voltage at the clamp voltage control (Vc) terminal 412 is approximately equal to the voltage at the well bias voltage clamp (Vclamp) terminal 414. The NW bias voltage (e.g., the NW bias voltage waveform 420 of FIG. 4B) follows the switching voltage (Vsw) responsive to the clamp transistor 402 turning on when the switching voltage (Vsw) is above the clamp voltage (Vc) plus the threshold voltage of the clamp transistor 402 (e.g., Vc+Vth). To prevent the diode circuit 404 from turning on and electrical current flowing into the well bias voltage clamp (Vclamp) terminal 414 through the diode circuit 404 while the clamp transistor 402 is turned on, the voltage at the well bias voltage clamp (Vclamp) terminal 414 is not to be greater than the clamp voltage (Vc) plus the threshold voltage of the clamp transistor 402 plus one diode voltage drop (e.g., Vc+Vth+one diode voltage drop).

Responsive to the switching voltage (Vsw) dropping below the clamp voltage (Vc) plus the threshold voltage of the clamp transistor 402 (Vc+Vth), the clamp transistor 402 turns off and the NW bias voltage (e.g., the NW bias voltage waveform 420) enters into a floating state. In such instances, the voltage at the voltage clamp (Vclamp) terminal 414 keeps the NW bias voltage (e.g., the NW bias voltage waveform 420) from dropping below Vclamp minus one diode voltage drop (e.g., the bias clamp voltage level 422 of FIG. 4B). The clamp voltage (Vc) is determined by considering the gate-to-source voltage (Vgs) breakdown voltage of the clamp transistor 402. Responsive to the switching voltage (Vsw) becoming the most positive voltage, the NW bias voltage (e.g., the NW bias voltage waveform 420) becomes equal to the switching voltage (Vsw) and Vgs=(NW−Vc)=(Vsw−Vc). Since there is a voltage rating for the Vgs of the clamp transistor 402, Vc−Vsw is not to exceed that rating.

Figure 4B:
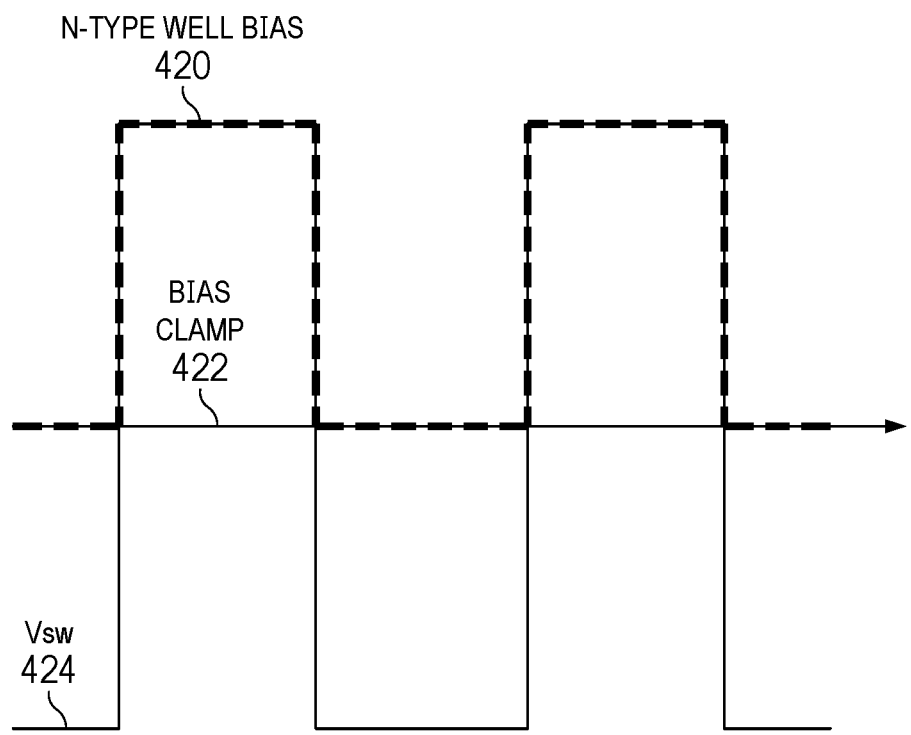
FIG. 4B is an example waveform of voltage clamping generated by the NW voltage clamp circuit of FIG. 4A to control an n-type well bias.

FIG. 4B is an example NW bias voltage waveform 420 of voltage clamping generated by the NW voltage clamp circuit 400 of FIG. 4A to control an n-type well bias in, for example, the NW region 152 (FIGS. 1A and 1B). The NW bias voltage waveform 420 shows how setting the voltage at the clamp voltage control (Vc) terminal 412 of FIG. 4A for the NW voltage clamp circuit 400 causes the well bias voltage at the NW region 152 to remain above a bias clamp level 422 and be clamped or limited to the bias clamp level 422, even when the voltage level of a switching voltage (Vsw) 424 goes below the bias clamp level 422.

For example, responsive to the Vsw voltage level 424 increasing to a voltage above the bias clamp voltage level 422, the voltage at the drain (D) terminal of the clamp transistor 402 increases causing the clamp transistor 402 to switch to an on state. In the on state, the clamp transistor 402 generates a voltage bias above the bias clamp voltage level 422 in an NW region (e.g., the NW region 152 and/or the NBL region 156 (which is also an NW region) of FIGS. 1A and 1B). Since the clamp transistor 402 is switched to an on state, the NW voltage clamp circuit 400 allows the well bias voltage in the NW region to follow the Vsw voltage level 424 above the bias clamp voltage level 422 as shown by the NW bias voltage waveform 420.

However, responsive to the Vsw voltage level 424 decreasing to a voltage below the bias clamp voltage level 422, the diode circuit 404 clamps the well bias voltage of the NW region at or approximately at the bias clamp voltage level 422. This clamping is responsive to the clamp transistor 402 turning off. The clamp transistor 402 turns off responsive to the Vsw voltage level 424 decreasing at the drain (D) terminal of the clamp transistor 402 below the bias clamp voltage level 422. For example, the switch off of the clamp transistor 402 is responsive to the Vsw voltage level 424 decreasing toward a lowest voltage (e.g., toward a negative voltage if the Vc terminal 412 and the Vclamp terminal 414 are tied to ground). In this manner, the NW voltage clamp circuit 400 can be used to limit or clamp the well bias voltage for the NW region 152. This prevents or substantially reduces the likelihood of switching on the parasitic NPN transistor 150 and the parasitic PNP transistor 166 (FIG. 1A), even if an isolation voltage (Viso) (e.g., the Viso supply 160 of FIG. 1A) is shorted to ground. In some examples, the clamping of the well bias voltage is approximated to be at the bias clamp voltage level 422 offset by a threshold voltage (Vth) of a transistor and/or offset by a forward drop voltage of a diode due to transistor and/or diode characteristics of the NW voltage clamp circuit 400.

In examples described herein, to control the amount of well bias voltage in the NW region 152, the voltage at the clamp voltage control (Vc) terminal 412 can be set to any suitable (e.g., selected or target) voltage. For example, as long as the voltage at the well bias voltage clamp (Vclamp) terminal 414 is not greater than the clamp voltage (Vc) plus the threshold voltage of the clamp transistor 402 plus one diode voltage drop (e.g., Vc+Vth+one diode voltage drop). In some examples, the voltage at the clamp voltage control (Vc) terminal 412 can be statically set for the NW voltage clamp circuit 400 by connecting the clamp voltage control (Vc) terminal 412 to a fixed voltage level to limit or clamp the well bias voltage at the NW region 152 to a fixed minimum level. For example, the clamp voltage control (Vc) terminal 412 is connected to ground so that the minimum well bias voltage is ground (e.g., 0V). Alternatively, the clamp voltage control (Vc) terminal 412 may be connected to any other suitable fixed voltage level to limit or clamp the well bias voltage generated by the NW voltage clamp circuit 400 at that voltage level. In other examples, the voltage at the clamp voltage control (Vc) terminal 412 can be dynamically changed by connecting the clamp voltage control (Vc) terminal 412 to a gate voltage controller such as the gate voltage controller 172 of FIG. 1B. In such examples, the maximum well bias voltage generated by the NW voltage clamp circuit 400 is controlled by the gate voltage controller.

Figure 5:
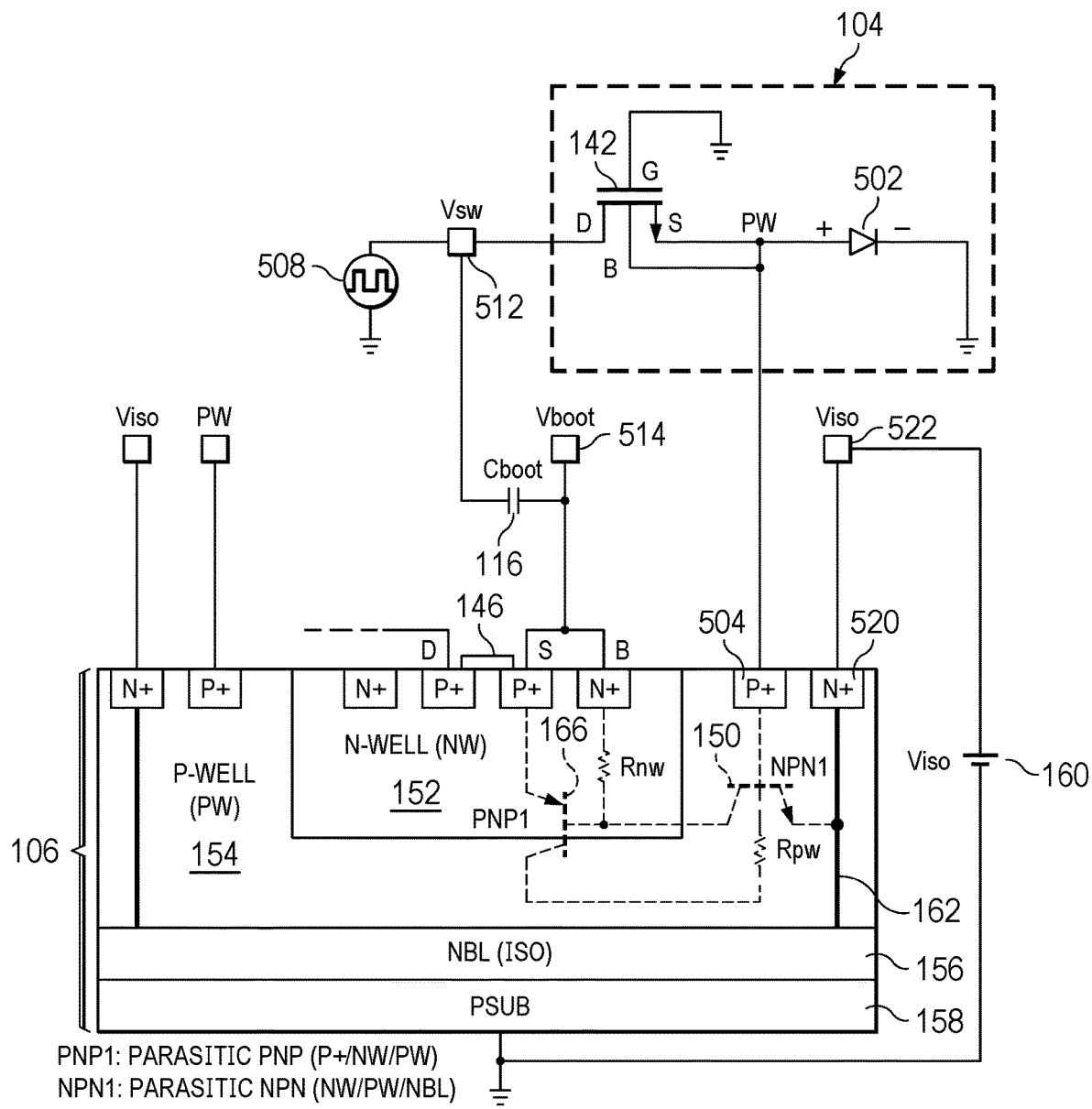
FIG. 5 is the example semiconductor device and the example PW voltage clamp circuit of FIGS. 1A and 1B to control well bias in a p-type well region of the semiconductor device.

FIG. 5 illustrates the example semiconductor 106 of FIGS. 1A and 1B and the example PW voltage clamp circuit 104 of FIG. 1A to control well bias in the PW region 154 of the semiconductor device 106. The example semiconductor 106 includes the substrate 158 which includes the Vboot transistor 146 and the PW region 154 formed thereon. The Vboot transistor 146 is formed in the NW region 152 abutting the PW region 154. As described above in connection with FIG. 1A, the Vboot transistor 146 is part of the gate driver output stage 144.

In FIG. 5, the diode circuit 140 of the example PW voltage clamp circuit 104, as shown in FIG. 1A, is implemented using a diode component 502. The diode component 502 includes an anode (+) terminal and a cathode (−) terminal. In example FIG. 5, the anode (+) terminal of the diode component 502 implements the circuit terminal 308 of the diode circuit 304 as shown in FIG. 3A, and the cathode (−) terminal of the diode component 502 implements the clamp reference terminal 306 of the diode circuit 304. The anode (+) terminal is coupled to a P+ tap 504 of the PW region 154. As used herein, a tap (e.g., a P+ tap, an N+ tap) is an electrically conductive terminal or connection access point in the semiconductor device 106 that allows electrical connectivity to a part of the semiconductor device 106. For example, a P+ tap allows electrical connectivity to a part of the semiconductor device 106 that includes a p-type semiconductor material. An N+ tap allows electrical connectivity to a part of the semiconductor device 106 that includes an n-type semiconductor material.

The example PW voltage clamp circuit 104 includes the clamp transistor 142 which includes a drain (D) terminal, a source(S) terminal, a gate (G) terminal, and a body (B). The drain (D) terminal of the clamp transistor 142 is coupled to a switching voltage (Vsw) supply 508 via a Vsw terminal 512. The source(S) terminal and the body (B) of the clamp transistor 142 are coupled to the P+ tap 504 of the PW region 154 and to the anode (+) terminal of the diode component 502.

In FIG. 5, the Vboot transistor 146 includes a source(S) terminal and a body (B), both of which are connected to a bootstrap voltage (Vboot) terminal 514. Also in FIG. 5, the drain (D) terminal of the clamp transistor 142 is coupled to the bootstrap voltage (Vboot) terminal 514 via the bootstrap voltage capacitor (Cboot) 116. The Vboot transistor 146 is shown in FIG. 5 as a p-channel metal-oxide semiconductor (PMOS) transistor. The clamp transistor 142 is shown in FIG. 5 as an n-channel metal-oxide semiconductor (NMOS) transistor.

However, in other examples, the Vboot transistor 146 and the clamp transistor 142 may be implemented using any other suitable types of transistors.

In FIG. 5, the gate (G) terminal of the clamp transistor 142 is coupled to ground. The cathode (−) terminal of the diode component 502 is also coupled to ground. As such, the PW voltage clamp circuit 104 is configured to limit or clamp a well bias voltage for the PW region 154 at ground (e.g., 0 V) as described above in connection with FIG. 3B. For example, the PW region 154 is biased by an internal voltage generated by the PW voltage clamp circuit 104 to prevent the parasitic transistors 150, 166 (FIG. 1A) from being forward biased. Also in FIG. 5, the NBL region 156, between the PW region 154 and the substrate 158, includes an N+ tap 520 coupled to an isolation voltage (Viso) terminal 522 that is coupled to the isolation voltage (Viso) supply 160.

Figure 6:
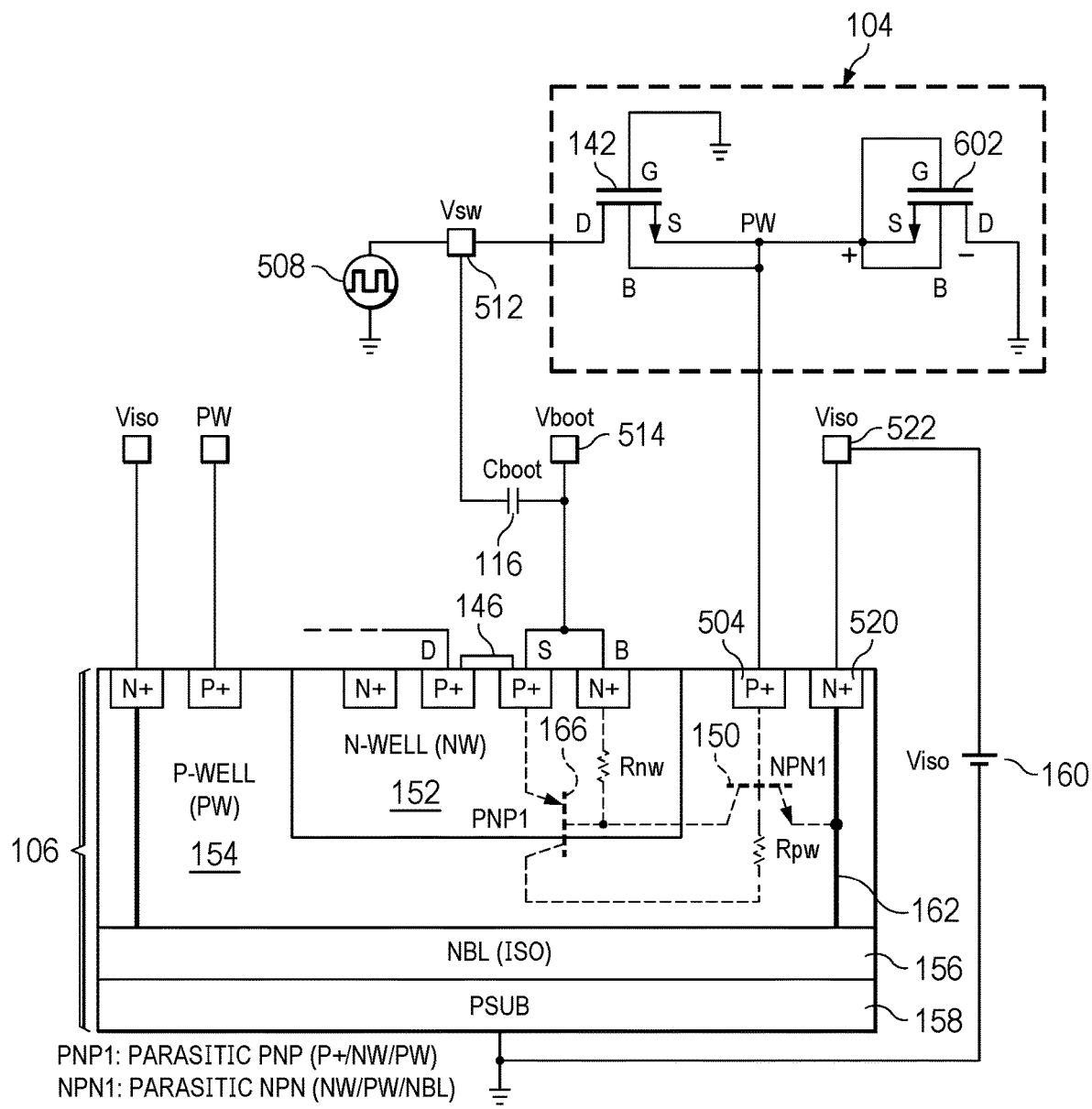
FIG. 6. is the example semiconductor device of FIGS. 1A and 1B and an alternative implementation of the example PW voltage clamp circuit of FIGS. 1A and 1B to control well bias in a p-type well region of the semiconductor device.

FIG. 6. is the example semiconductor device 106 of FIGS. 1A and 1B and an alternative implementation of the example PW voltage clamp circuit 104 to control well bias in the PW region 154 of the semiconductor device 106. The semiconductor device 106 and the example PW voltage clamp circuit 104 of FIG. 6 are substantially similar in both FIGS. 5 and 6. For example, the PW voltage clamp circuit 104 is connected to the semiconductor device 106 in FIG. 6 in substantially the same way as described above in connection with FIG. 5. However, unlike the PW voltage clamp circuit 104 of FIG. 5 which implements the diode circuit 140 shown in FIG. 1A using a diode component 502, the PW voltage clamp circuit 104 of FIG. 6 implements the diode circuit 140 shown in FIG. 1A using a diode-connected transistor 602. For example, the diode-connected transistor 602 is formed by connecting a gate (G) terminal, a source(S) terminal, and a body (B) of the diode-connected transistor 602 to one another. In this manner, the diode-connected transistor 602 forms a p-n junction diode.

In FIG. 6, the gate (G) terminal, the source(S) terminal, and the body (B) of the diode-connected transistor 602 form an anode (+) terminal connected to the source(S) terminal and the body (B) of the clamp transistor 142 and to the PW region 154 via the P+ tap 504. In addition, the drain (D) terminal of the diode-connected transistor 602 forms a cathode (−) terminal that is connected to ground. As such, the anode (+) terminal (e.g., the gate (G) terminal, source(S) terminal, and body (B) connected to one another) of the diode-connected transistor 602 is equivalent to the circuit terminal 308 of the diode circuit 304 shown in FIG. 3A, and the cathode (−) (e.g., the drain (D) terminal) of the diode-connected transistor 602 is equivalent to the clamp reference terminal 306 of the diode circuit 304.

In some implementations, a diode-connected transistor such as the diode-connected transistor 602 may be preferable over a diode component because a transistor may be more readily available for fabricating in a semiconductor device using a particular manufacturing process. For example, a particular semiconductor device manufacturing process may not be able to form a diode component in a semiconductor device due to limitations of that fabrication process but is able to form transistors. In addition, a transistor can be implemented using a smaller semiconductor area (e.g., a smaller footprint) than a diode. In addition, a diode may create unwanted parasitic electrical effects that are not created by a diode-connected transistor.

Figure 7:
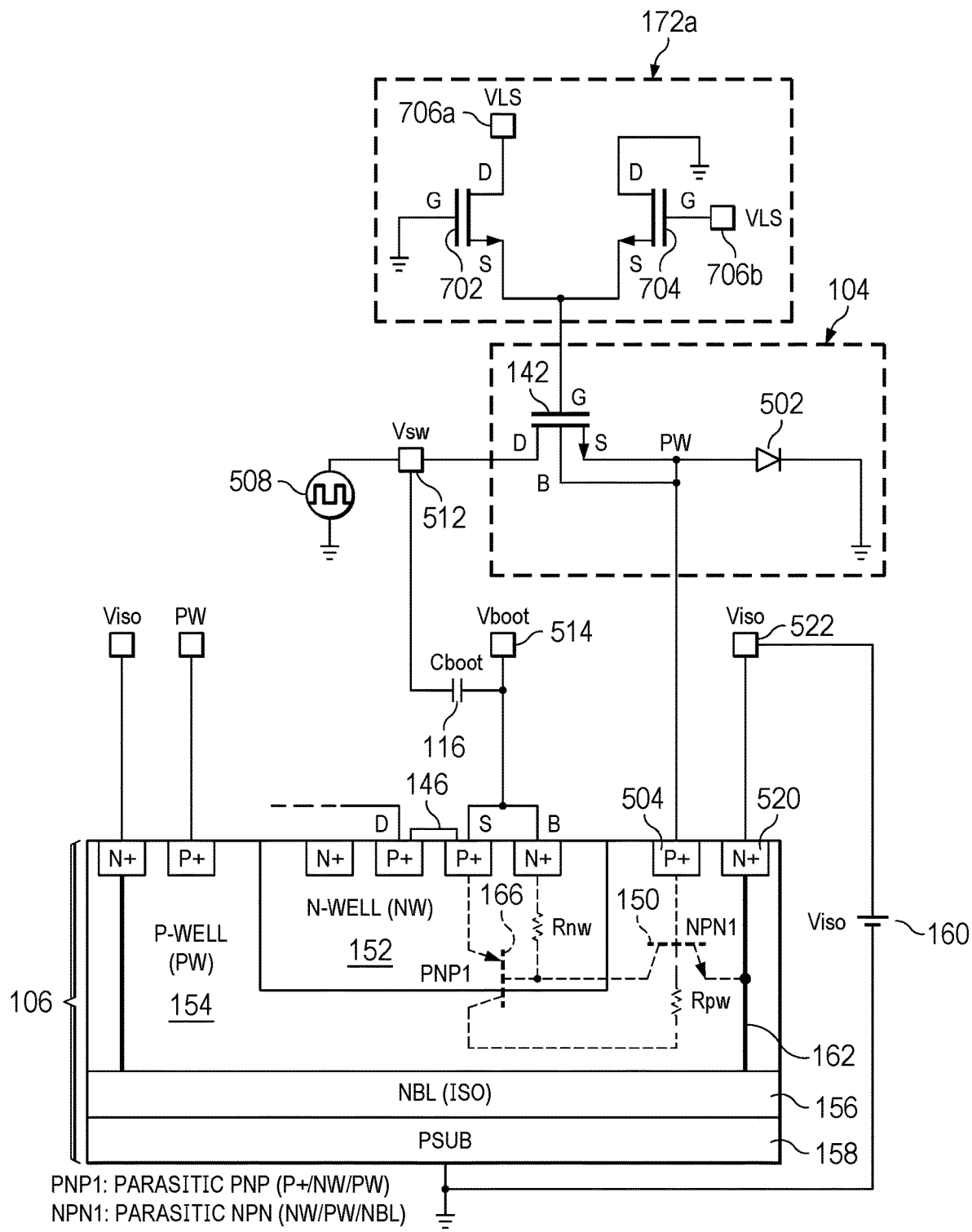
FIG. 7 is the example semiconductor and the example PW voltage clamp circuit of FIGS. 1A and 1B coupled to a gate voltage controller of FIG. 1B to accommodate more negative output voltages and control well bias in a p-type well region of the semiconductor device.

FIG. 7 is the example semiconductor device 106 and the example PW voltage clamp circuit 104 of FIGS. 1A and 1B connected to a gate voltage controller 172a which is an example implementation of the gate voltage controller 172 of FIG. 1B. The PW voltage clamp circuit 104 is connected to the semiconductor device 106 in FIG. 7 in substantially the same way as described above in connection with FIG. 5. The gate voltage controller 172a may be used to accommodate more negative output voltages of the PW voltage clamp circuit 104 and control well bias in the PW region 154 of the semiconductor device 106.

The semiconductor device 106 and the example PW voltage clamp circuit 104 of FIG. 7 are substantially similar in both FIGS. 5 and 7. However, unlike the PW voltage clamp circuit 104 of FIG. 5 in which the gate (G) terminal of the clamp transistor 142 is connected to ground, the gate (G) terminal of the clamp transistor 142 of FIG. 7 is connected to the gate voltage controller 172a. In this manner, the gate voltage controller 172a enables dynamically controlling a voltage range of the PW voltage clamp circuit 104. For example, the gate voltage controller 172a can be used to control a gate voltage at the gate (G) terminal of the clamp transistor 142 to accommodate more negative output voltages for a PW voltage bias in a negative voltage domain of the PW region 154. This is to ensure or increase the likelihood that the voltage in the PW region 154 remains less than or equal to the voltage in the NW region 152. However, to prevent a parasitic diode between the substrate 158 and the NBL region 156 from turning on, the voltage level in the NBL region 156 is not to be one diode voltage drop below ground.

In FIG. 7, the gate voltage controller 172a includes a first gate voltage control transistor 702 (e.g., an NFET transistor) and a second gate voltage control transistor 704 (e.g., an NFET transistor). The first gate voltage control transistor 702 includes a drain (D) terminal, a source(S) terminal, and a gate (G) terminal. The gate (G) terminal of the first gate voltage control transistor 702 is coupled to ground and the drain (D) terminal of the first gate voltage control transistor 702 is coupled to a low-side gate driver voltage (VLS) terminal 706a. The second gate voltage control transistor 704 includes a drain (D) terminal, a source(S) terminal, and a gate (G) terminal. The gate (G) terminal of the second gate voltage control transistor 704 is coupled to a low-side gate driver voltage (VLS) terminal 706b. The drain (D) terminal of the second gate voltage control transistor 704 is coupled to ground. The source(S) terminal of the second gate voltage control transistor 704 and the source(S) terminal of the first gate voltage control transistor 702 are coupled to the gate (G) terminal of the clamp transistor 142 of the PW voltage clamp circuit 104.

The low-side gate driver voltage (VLS) is generated to maintain a certain voltage within the voltage rating of the LS gate driving circuit 108 (FIG. 1A) relative to the negative output voltage (Vout) of the voltage converter circuit 100. Because the output voltage (Vout) does not vary with the switching voltage (Vsw), which is switching at a switching frequency, the low-side gate driver voltage (VLS) is relatively constant compared to the switching voltage (Vsw). For example, a switching converter (e.g., an inverting buck-boost (IBB) voltage converter) has a switching frequency of, for example, 1 megahertz (MHz). As such, it can generate the output voltage (Vout) by switching at 1 MHz. The output voltage (Vout) is to be stable since it is a regulated voltage. When the output voltage (Vout) is programmed to a different voltage, the IBB voltage converter will try to adjust the output voltage (Vout) and finally settle down to the new output voltage (Vout). In the meantime, to guarantee the voltage ratings of devices in the LS gate driving circuit 108 sitting on the voltage output (Vout) domain, the low-side gate driver voltage (VLS) is defined and generated relative to the voltage output (Vout).

If the LS gate driving circuit 108 is composed of 5V devices, the low-side gate driver voltage (VLS) is generated to be equal to or less than the voltage output (Vout) plus 5 volts (Vout+5V), where the output voltage (Vout) is a negative voltage. A programming rate of the output voltage (Vout) is much slower than the switching frequency of 1 MHz. In many applications, requiring a constant output voltage (Vout) does not change at all. As such, the low-side gate driver voltage (VLS) does not change either. Because the switching voltage (Vsw) goes negative down to the output voltage (Vout) while switching at 1 MHz, the gate voltage of the clamp transistor 142 is to be protected by defining its gate-to-source voltage (Vgs) within its rating. Because the low-side gate driver voltage (VLS) is generated relative to the output voltage (Vout) to be safe, the output of the gate voltage controller 172a is also generated such that the Vgs of the clamp transistor 142 is protected.

When the output voltage (Vout) is a very low negative voltage (e.g., −8V), the low-side gate driver voltage (VLS) can remain negative (e.g., Vout+5V=−3V). This switches on the first gate voltage control transistor 702 while the second gate voltage control transistor 704 turns off, so the output of the gate voltage controller 172a becomes −3V. When the output voltage (Vout) is a less negative voltage (e.g., −3V), the low-side gate driver voltage (VLS) becomes positive (e.g., −3V+5V=2V). Under this condition, the second gate voltage control transistor 704 turns on and the first gate voltage control transistor 702 turns off. As such, the output of the gate voltage controller 172a becomes +2V through the second gate voltage control transistor 704.

As shown in FIG. 1B, the low-side gate driver voltage (VLS) is already available to the LS gate driving circuit 108 of the voltage converter circuit 100 and can be used for the gate voltage controller 172a. However, in other implementations, a separately generated voltage can be used in place of the low-side gate driver voltage (VLS) applied to the gate voltage controller 172a. In such implementations, the separately generated voltage is to be defined in a manner that protects the Vgs of the clamp transistor 142. When the output voltage (Vout) of the voltage converter circuit 100 is a more negative voltage (e.g., −8V), the voltage at the well bias voltage clamp (Vclamp) terminal 314 (FIG. 3A) is to be −3V or below for 5V devices. When the output voltage (Vout) is a less negative voltage like −2V, the voltage at the well bias voltage clamp (Vclamp) terminal 314 is to be +3V or below for 5V devices. The details of the gate voltage controller 172a shown in FIG. 7 represent an example of how the gate voltage controller 172a may be implemented. In other examples, any other suitable circuit design may be used to implement the gate voltage controller 172a.

Figure 8:
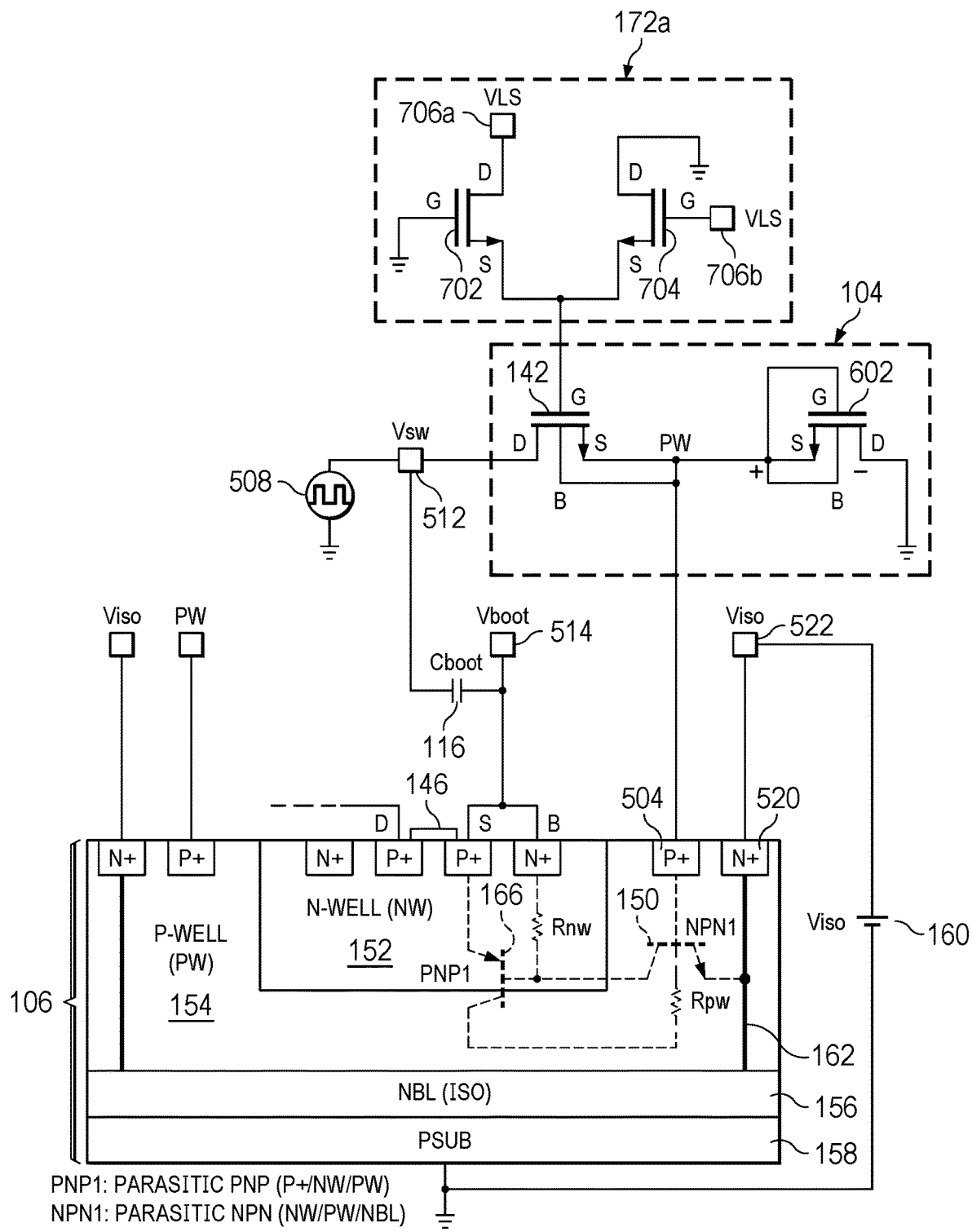
FIG. 8 is the example semiconductor device of FIGS. 1A and 1B and the alternative example PW voltage clamp circuit of FIG. 6 coupled to the gate voltage controller of FIG. 7 to accommodate more negative output voltages and control well bias in a p-type well region of the semiconductor device.

FIG. 8 is the example semiconductor device 106 of FIGS. 1A and 1B and the alternative example PW voltage clamp circuit 104 of FIG. 6 coupled to the gate voltage controller 172a of FIG. 7. The alternative example PW voltage clamp circuit 104 is to accommodate more negative output voltages and control well bias in the PW region 154 of the semiconductor device 106. The PW voltage clamp circuit 104 is connected to the semiconductor device 106 in FIG. 8 in substantially the same way as described above in connection with FIG. 5. For brevity, the circuit details of the gate voltage controller 172a described above in connection with FIG. 7 are not repeated here. FIG. 8 illustrates an example of how the gate voltage controller 172a may be connected to the gate (G) terminal of the clamp transistor 142 as described above in connection with FIG. 7. In addition, the source(S) terminal and body (B) of the clamp transistor 142 are connected to the anode (+) terminal of the diode-connected transistor 602 described above in connection with FIG. 6.

Figure 9:
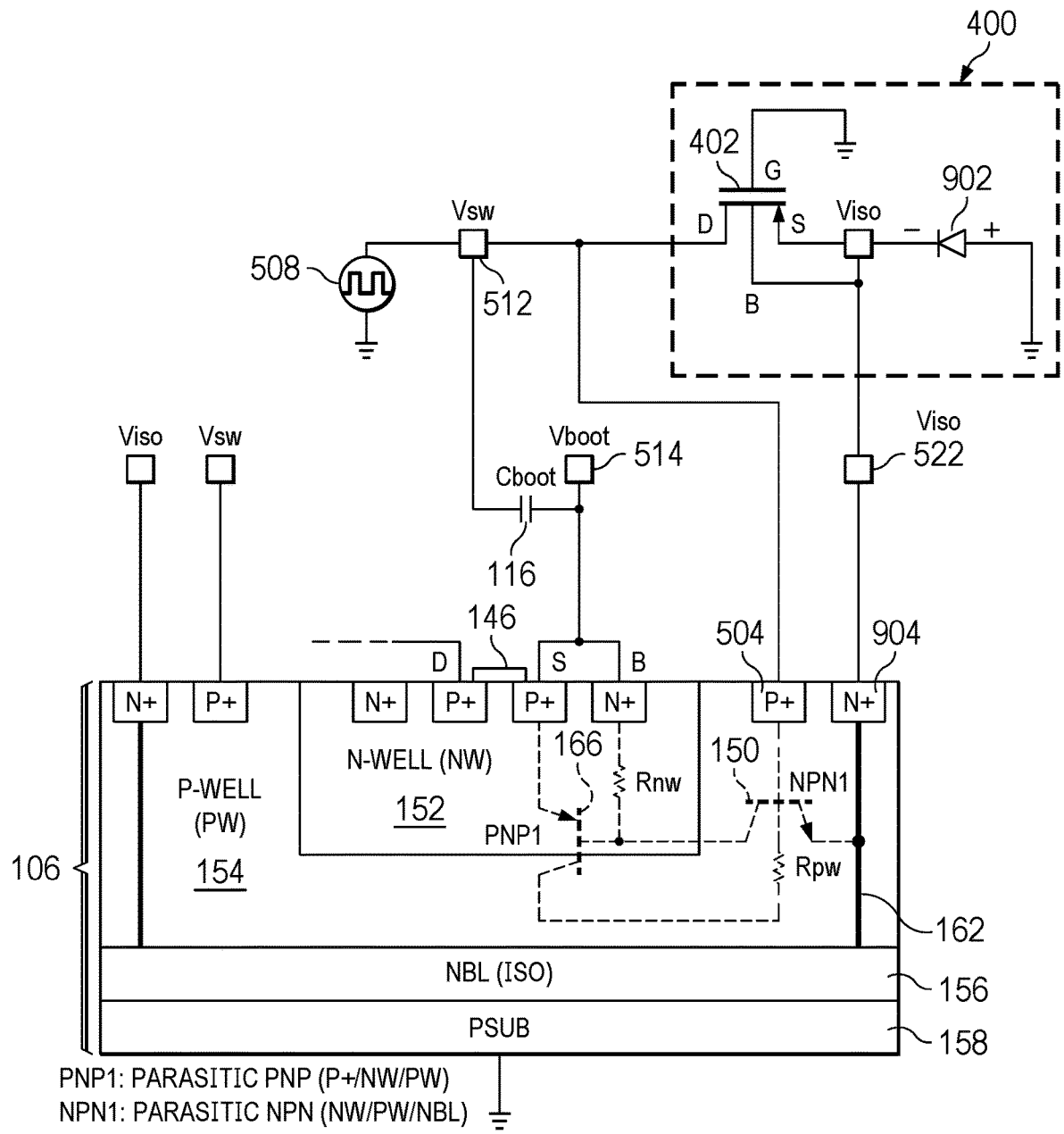
FIG. 9 is the example semiconductor device of FIGS. 1A and 1B and the example NW voltage clamp circuit of FIG. 4A to control well bias in an n-type well region of the semiconductor device.

FIG. 9 is the example semiconductor device 106 of FIGS. 1A and 1B and the example NW voltage clamp circuit 400 of FIG. 4A to control well bias in an n-type well region (e.g., the NBL region 156) of the semiconductor device 106. The example semiconductor 106 includes the substrate 158 which includes the Vboot transistor 146 and the NBL region 156 formed thereon. The NBL region 156 is an NW region (e.g., having a similar n-type semiconductor material as the NW region 152). The Vboot transistor 146 is part of the gate driver output stage 144 (FIG. 1A).

In FIG. 9, the diode circuit 404 of the example NW voltage clamp circuit 400, as shown in FIG. 4A, is implemented using a diode component 902. The diode component 902 includes a cathode (−) terminal and an anode (+) terminal. In example FIG. 9, the cathode (−) terminal of the diode component 902 implements the circuit terminal 408 of the diode circuit 404 as shown in FIG. 4A. The anode (+) terminal of the diode component 902 implements the clamp reference terminal 406 of the diode circuit 404. The anode (+) terminal is coupled to ground, and the cathode (−) terminal is coupled to an N+ tap 904 of the NBL region 156. As used herein, a tap (e.g., a P+ tap, an N+ tap) is an electrically conductive terminal or connection access point in the semiconductor device 106 that allows electrical connectivity to a part of the semiconductor device 106. For example, a P+ tap allows electrical connectivity to a part of the semiconductor device 106 that includes a p-type semiconductor material. An N+ tap allows electrical connectivity to a part of the semiconductor device 106 that includes an n-type semiconductor material.

The example NW voltage clamp circuit 400 includes the clamp transistor 402 which includes a drain (D) terminal, a source(S) terminal, a gate (G) terminal, and a body (B). The drain (D) terminal of the clamp transistor 402 is coupled to the switching voltage (Vsw) supply 508 via the Vsw terminal 512. The source(S) terminal and the body (B) of the clamp transistor 402 are coupled to the N+ tap 904 of the NBL region 156 and to the cathode (−) terminal of the diode component 002.

In FIG. 9, the Vboot transistor 146 includes a source(S) terminal and a body (B), both of which are connected to the bootstrap voltage (Vboot) terminal 514. Also in FIG. 9, the drain (D) terminal of the clamp transistor 402 is coupled to the bootstrap voltage (Vboot) terminal 514 via the bootstrap voltage capacitor (Cboot) 116. The Vboot transistor 146 is shown in FIG. 9 as a p-channel metal-oxide semiconductor (PMOS) transistor and the clamp transistor 402 is shown in FIG. 9 as a p-channel metal-oxide semiconductor (PMOS) transistor. However, in other examples, the Vboot transistor 146 and the clamp transistor 402 may be implemented using any other suitable types of transistors.

In FIG. 9, the gate (G) terminal of the clamp transistor 402 is coupled to ground. The anode (+) terminal of the diode component 902 is also coupled to ground. As such, the NW voltage clamp circuit 400 is configured to limit or clamp a well bias voltage for the NBL region 156 at ground (e.g., 0 V) as described above in connection with FIG. 4B. For example, the NBL region 156 is biased by an internal voltage generated by the NW voltage clamp circuit 400 to prevent the parasitic transistors 150, 166 (FIG. 1A) from being forward biased. Also in FIG. 9, the NBL region 156, between the PW region 154 and the substrate 158, includes an N+ tap 520 coupled to an isolation voltage (Viso) terminal 522 that is coupled to the isolation voltage (Viso) supply 160 (FIG. 5).

Figure 10:
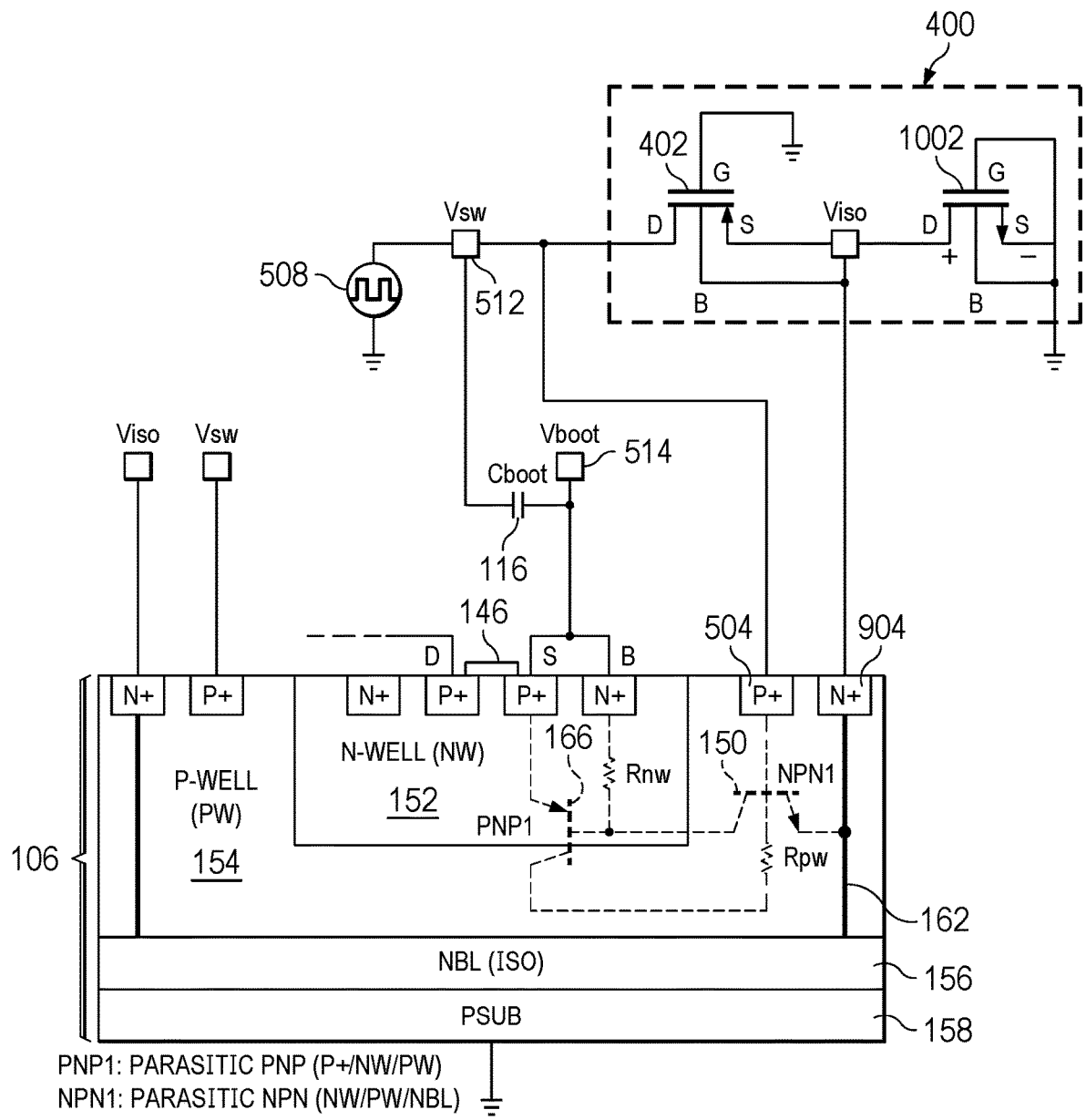
FIG. 10, is the example semiconductor device of FIGS. 1A and 1B and an alternative implementation of the example NW voltage clamp circuit of FIG. 4A to control well bias in an n-type well region of the semiconductor device.

FIG. 10 is the example semiconductor device 106 of FIGS. 1A and 1B and an alternative implementation of the example NW voltage clamp circuit 400 of FIG. 4A to control well bias in an n-type well region (e.g., the NBL region 156) of the semiconductor device 106. The semiconductor device 106 and the example NW voltage clamp circuit 400 of FIG. 10 are substantially similar in both FIGS. 9 and 10. For example, the NW voltage clamp circuit 400 is connected to the semiconductor device 106 in FIG. 10 in substantially the same way as described above in connection with FIG. 9. However, unlike the NW voltage clamp circuit 400 of FIG. 9 which implements the diode circuit 404 shown in FIG. 4A using a diode component 902, the NW voltage clamp circuit 400 of FIG. 10 implements the diode circuit 404 shown in FIG. 4A using a diode-connected transistor 1002. For example, the diode-connected transistor 1002 is formed by connecting a gate (G) terminal, a source(S) terminal, and a body (B) of the diode-connected transistor 1002 to one another. In this manner, the diode-connected transistor 1002 forms a p-n junction diode.

In FIG. 10, the drain (D) terminal of the diode-connected transistor 1002 forms a cathode (−) terminal that is connected to the source(S) terminal and the body (B) of the clamp transistor 402 and to the NBL region 156 via the N+ tap 904. In addition, the gate (G) terminal, the source(S) terminal, and the body (B) of the diode-connected transistor 1002 form an anode (+) terminal connected to ground. As such, the anode (+) terminal (e.g., the gate (G) terminal, source(S) terminal, and body (B) connected to one another) of the diode-connected transistor 1002 is equivalent to the clamp reference terminal 406 of the diode circuit 404 shown in FIG. 4A, and the cathode (−) (e.g., the drain (D) terminal) of the diode-connected transistor 1002 is equivalent to the circuit terminal 408 of the diode circuit 404.

In some implementations, a diode-connected transistor such as the diode-connected transistor 1002 may be preferable over a diode component because a transistor may be more readily available for fabricating in a semiconductor device using a particular manufacturing process. For example, a particular semiconductor device manufacturing process may not be able to form a diode component in a semiconductor device due to limitations of that fabrication process but is able to form transistors. In addition, a transistor can be implemented using a smaller semiconductor area (e.g., a smaller footprint) than a diode. In addition, a diode may create unwanted parasitic electrical effects that are not created by a diode-connected transistor.

Figure 11:
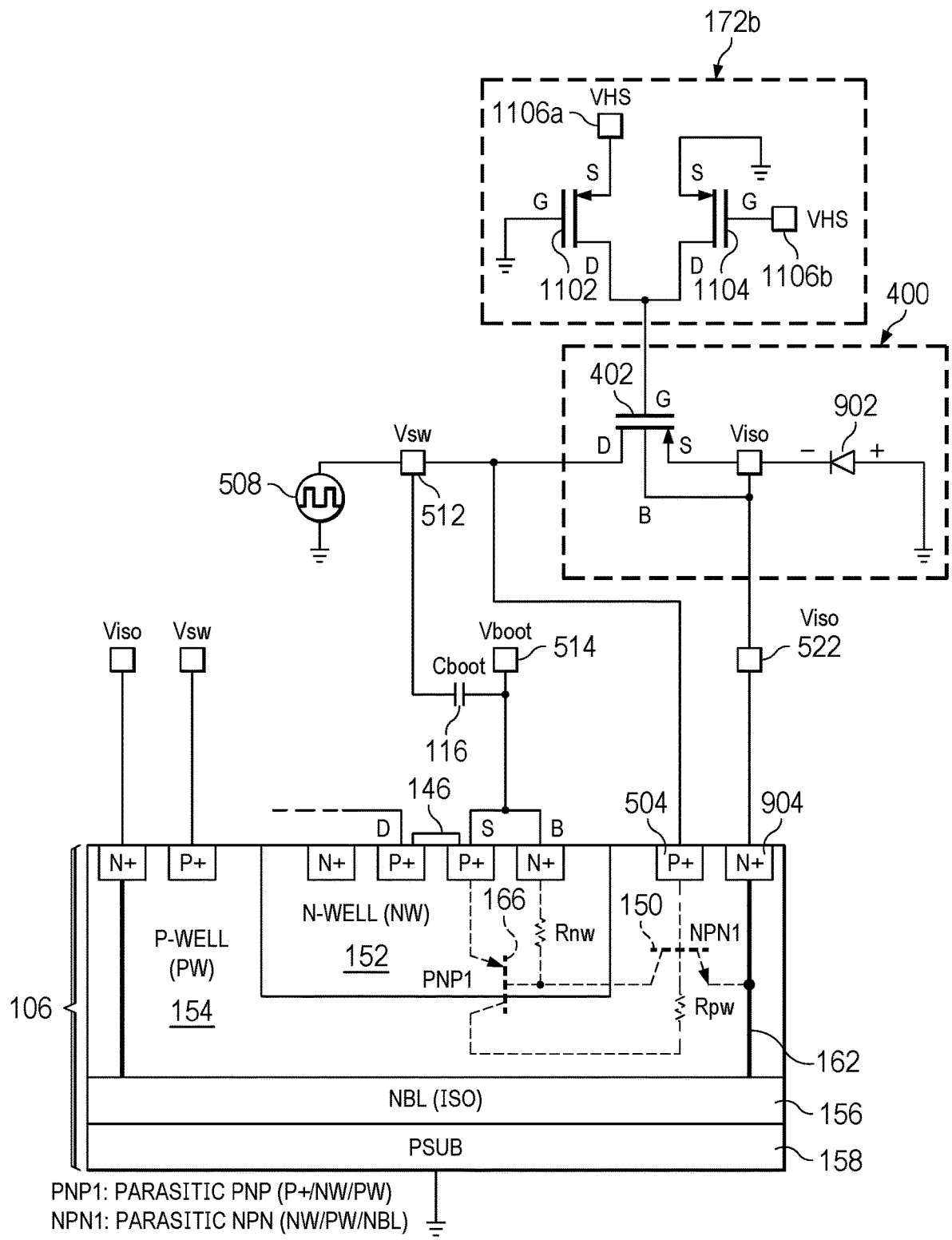
FIG. 11 is the example semiconductor device of FIGS. 1A and 1B and the example NW voltage clamp circuit of FIG. 9 coupled to a gate voltage controller to accommodate more positive output voltages and control well bias in an n-type well region of the semiconductor device.

FIG. 11 is the example semiconductor device 106 of FIGS. 1A and 1B and the example NW voltage clamp circuit 400 of FIG. 9 coupled to a gate voltage controller 172b. The gate voltage controller 172b of FIG. 11 is an alternative implementation of the gate voltage controller 172 of FIG. 1B. The gate voltage controller 172b is to accommodate more positive output voltages and control well bias in a positive voltage domain of an n-type well region (e.g., the NBL region 156) of the semiconductor device 106. This ensures or increases the likelihood that the voltage of the n-type well region (e.g., the NBL region 156) remains greater than or equal to the voltage in the PW region 154. However, to prevent a parasitic diode between the substrate 158 and the NBL region 156 from turning on, the voltage level in the NBL region 156 is not to be one diode voltage drop below ground.

The NW voltage clamp circuit 400 is connected to the semiconductor device 106 in FIG. 11 in substantially the same way as described above in connection with FIG. 9. The gate voltage controller 172b illustrated in FIG. 11 is used for positive domain switching voltage converters like boost voltage converters. For example, the gate voltage controller 172b of FIG. 11 may be used to accommodate more positive output voltages of the NW voltage clamp circuit 400 and control well bias in the NBL region 156 of the semiconductor device 106. The semiconductor device 106 and the example NW voltage clamp circuit 400 of FIG. 11 are substantially similar in both FIGS. 9 and 11. However, unlike the NW voltage clamp circuit 400 of FIG. 9 in which the gate (G) terminal of the clamp transistor 402 is connected to ground, the gate (G) terminal of the clamp transistor 402 of FIG. 11 is connected to the gate voltage controller 172b. In this manner, the gate voltage controller 172b enables dynamically controlling a voltage range of the NW voltage clamp circuit 400. For example, the gate voltage controller 172b can be used to control a gate voltage at the gate (G) terminal of the clamp transistor 402 to accommodate more positive output voltages for an NW voltage bias of the NBL region 156 (and more negative output voltages for a PW voltage bias of the PW region 154 in connection with the examples of FIGS. 7 and 8 described above).

In FIG. 11, the gate voltage controller 172b includes a first gate voltage control transistor 1102 (e.g., a PFET transistor) and a second gate voltage control transistor 1104 (e.g., a PFET transistor). The first gate voltage control transistor 1102 includes a drain (D) terminal, a source(S) terminal, and a gate (G) terminal. The gate (G) terminal of the first gate voltage control transistor 1102 is coupled to ground. The source(S) terminal of the first gate voltage control transistor 1102 is coupled to a high-side gate driver voltage (VHS) terminal 1106a. The second gate voltage control transistor 1104 includes a drain (D) terminal, a source(S) terminal, and a gate (G) terminal. The gate (G) terminal of the second gate voltage control transistor 1104 is coupled to a high-side gate driver voltage (VHS) terminal 1106b. The source(S) terminal of the second gate voltage control transistor 1104 is coupled to ground. The drain (D) terminal of the second gate voltage control transistor 1104 and the drain (D) terminal of the first gate voltage control transistor 1102 are coupled to the gate (G) terminal of the clamp transistor 402 of the NW voltage clamp circuit 400.

The high-side gate driver voltage (VHS) is generated to maintain a certain voltage within the voltage rating of a HS gate driving circuit such as the gate driving circuit 102 (FIG. 1A) relative to the positive output voltage (Vout) of the voltage converter circuit 100. Because the output voltage (Vout) does not vary with the switching voltage (Vsw), which is switching at a switching frequency, the high-side gate driver voltage (VHS) is relatively constant compared to the switching voltage (Vsw). For example, a switching converter (e.g., a boost voltage converter) has a switching frequency of, for example, 1 megahertz (MHz). As such, it can generate the output voltage (Vout) by switching at 1 MHz. The output voltage (Vout) is to be stable since it is a regulated voltage. When the output voltage (Vout) is programmed to a different voltage, the boost voltage converter will try to adjust the output voltage (Vout) and finally settle down to the new output voltage (Vout). In the meantime, to guarantee the voltage ratings of devices in the HS gate driving circuit 102 sitting on the voltage output (Vout) domain, the high-side gate driver voltage (VHS) is defined and generated relative to the voltage output (Vout).

If the HS gate driving circuit 102 is composed of 5V devices, the high-side gate driver voltage (VHS) is generated to be equal to or greater than the voltage output (Vout) minus 5 volts (Vout-5V), where the output voltage (Vout) is a positive voltage. A programming rate of the output voltage (Vout) is much slower than the switching frequency of 1 MHz. In many applications, requiring a constant output voltage (Vout) does not change at all. As such, the high-side gate driver voltage (VHS) does not change either. Because the switching voltage (Vsw) goes positive up to the output voltage (Vout) while switching at 1 MHz, the gate voltage of the clamp transistor 402 is to be protected by defining its gate-to-source voltage (Vgs) within its rating. Because the high-side gate driver voltage (VHS) is generated relative to the output voltage (Vout) to be safe, the output of the gate voltage controller 172b is also generated such that the Vgs of the clamp transistor 402 is protected.

When the output voltage (Vout) is a very high positive voltage (e.g., 8V), the high-side gate driver voltage (VHS) can remain positive (e.g., Vout-5V=3V). This switches on the first gate voltage control transistor 1102 while the second gate voltage control transistor 1104 turns off, so the output of the gate voltage controller 172b becomes 3V. When the output voltage (Vout) is a less positive voltage (e.g., 3V), the high-side gate driver voltage (VHS) becomes negative (e.g., 3V-5V=-2V). Under this condition, the second gate voltage control transistor 1104 turns on and the first gate voltage control transistor 1102 turns off. As such, the output of the gate voltage controller 172b becomes -2V through the second gate voltage control transistor 1104 which drives the gate (G) terminal of the clamp transistor 402 to ground.

In high voltage boost converters, an internal floating voltage rail can be used for the high-side gate driver voltage (VHS) terminals 1106a,b. Using a high-side gate driver voltage (VHS) provides flexibility for the gate voltage controller 172b to support a wider voltage range. For example, the gate-to-source voltage (Vgs) for the clamp transistor 402 in the NW voltage clamp circuit 400 is protected by the high-side gate driver voltage (VHS) when the switching voltage (Vsw) rises to the output voltage (Vout) (which could exceed the voltage rating if the gate (G) terminal of the clamp transistor 402 were grounded). Accordingly, the high-side gate driver voltage (VHS) is kept at a level that is greater than or equal to the output voltage (Vout) minus the voltage rating of the clamp transistor 402 (e.g., VHS>=(Vout-voltage rating of clamp transistor 402)).

However, in other implementations, a separately generated voltage can be used in place of the high-side gate driver voltage (VHS) applied to the gate voltage controller 172b. In such implementations, the separately generated voltage is to be defined in a manner that protects the Vgs of the clamp transistor 402. When the output voltage (Vout) of the voltage converter circuit 100 is a more positive voltage (e.g., 8V), the voltage at the well bias voltage clamp (Vclamp) terminal 414 (FIG. 4A) is to be 3V or above for 5V devices. When the output voltage (Vout) is a less positive voltage like 2V, the voltage at the well bias voltage clamp (Vclamp) terminal 414 is to be -3V or above for 5V devices. The details of the gate voltage controller 172b shown in FIG. 11 represent an example of how the gate voltage controller 172b may be implemented. In other examples, any other suitable circuit design may be used to implement the gate voltage controller 172b.

Figure 12:
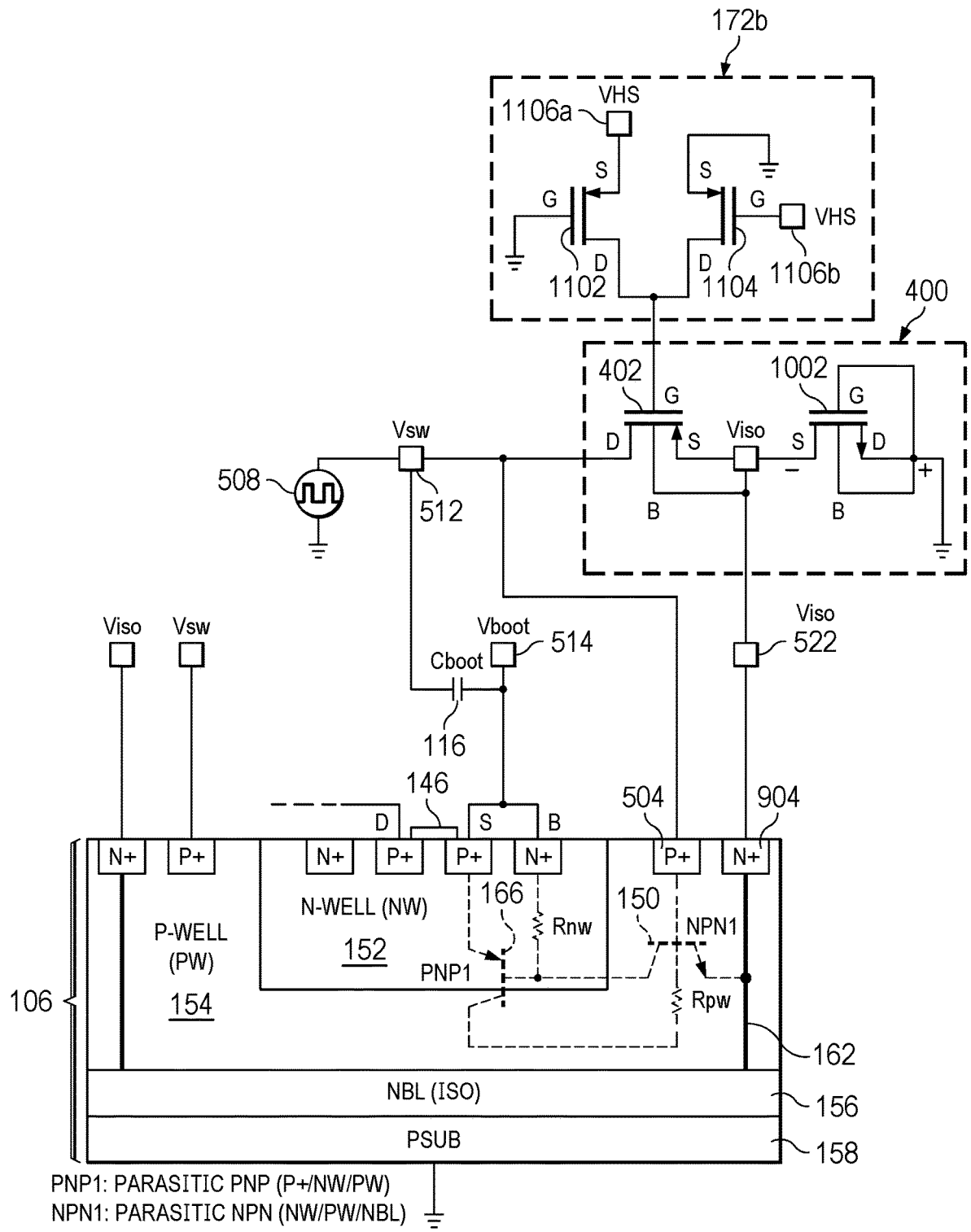
FIG. 12 is the example semiconductor device of FIGS. 1A and 1B and the alternative example NW voltage clamp circuit of FIG. 10 coupled to the gate voltage control circuit of FIG. 11 to accommodate more positive output voltages and control well bias in an n-type well region of the semiconductor device.

FIG. 12 is the example semiconductor device 106 of FIGS. 1A and 1B and the alternative example NW voltage clamp circuit 400 of FIG. 10 coupled to the gate voltage controller 172b of FIG. 11. The alternative example NW voltage clamp circuit 400 is to accommodate more positive output voltages and control well bias in an n-type well region (e.g., the NBL region 156) of the semiconductor device 106. The NW voltage clamp circuit 400 is connected to the semiconductor device 106 in FIG. 12 in substantially the same way as described above in connection with FIG. 9. For brevity, the circuit details of the gate voltage controller 172b described above in connection with FIG. 11 are not repeated here. FIG. 12 illustrates an example of how the gate voltage controller 172b may be connected to the gate (G) terminal of the clamp transistor 402 as described above in connection with FIG. 11. In addition, the source(S) terminal and body (B) of the clamp transistor 402 are connected to the cathode (−) terminal of the diode-connected transistor 1002 described above in connection with FIG. 10.

Figure 13:
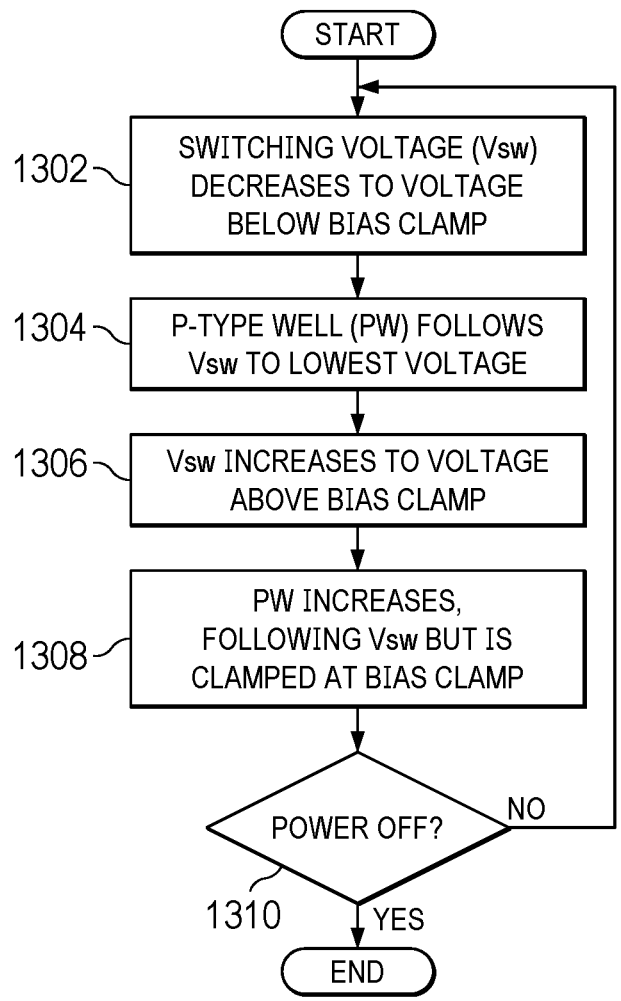
FIG. 13 is a flowchart of the operation of the example PW voltage clamp circuits of FIGS. 1A, 1B, 3A and 5-8 to control well bias in a p-type well region of a semiconductor device.

FIG. 13 is a flowchart of the operation of the example PW voltage clamp circuit 104 of FIGS. 1A, 1B, 3A, and 5-8 to control well bias in a p-type well region (e.g., the PW region 154) of the semiconductor device 106. At block 1302, a switching voltage (Vsw) decreases to a voltage below a bias clamp voltage level. For example, the Vsw supply 508 of FIGS. 5-8 decreases to a voltage below the bias clamp voltage level 322 of FIG. 3B. This decreases the voltage at the drain (D) terminal of the clamp transistor 142 (FIGS. 5-8) causing the clamp transistor 142 to switch to an on state. Responsive to being in the on state, the clamp transistor 142 generates a voltage bias below the bias clamp voltage level 322 in the PW region 154. If the bias clamp voltage level 322 is ground, the Vsw supply 508 of FIGS. 5-8 decreases to a negative voltage below the bias clamp voltage level 322 to generate a negative voltage bias in the PW region 154.

At block 1304, a PW region follows the Vsw voltage level to a lowest voltage. For example, because the clamp transistor 142 is switched to an on state, the PW voltage clamp circuit 104 allows the well bias voltage in the PW region 154 of FIGS. 5-8 to follow the Vsw voltage level. Accordingly, the well bias voltage follows the Vsw voltage level below the bias clamp voltage level 322 as shown by the PW bias voltage waveform 320 of FIG. 3B. At block 1306, the Vsw voltage level increases to a voltage above the bias clamp voltage level 322. For example, if the bias clamp voltage level 322 is ground, the Vsw supply 508 increases to a positive voltage above the bias clamp voltage level 322. At block 1308, the well bias voltage of the PW region 154 increases, following the Vsw voltage level but is clamped at the bias clamp voltage level 322. For example, the PW voltage clamp circuit 104 clamps the well bias voltage of the PW region 154 at the bias clamp voltage level 322, as shown by the PW bias voltage waveform 320 of FIG. 3B. The diode circuit 140 of the PW voltage clamp circuit 104 clamps the well bias voltage of the PW region 154 at the bias clamp voltage level 322. For example, this clamping is responsive to the clamp transistor 142 turning off after the Vsw voltage level of the Vsw supply 508 increases at the drain (D) terminal of the clamp transistor 142 above the bias clamp voltage level 322 and toward a highest voltage (e.g., toward a positive voltage). If power to the PW voltage clamp circuit 104 is not turned off (block 1310), the process of FIG. 13 starts again at block 1302. Otherwise, the process of FIG. 13 ends.

Figure 14:
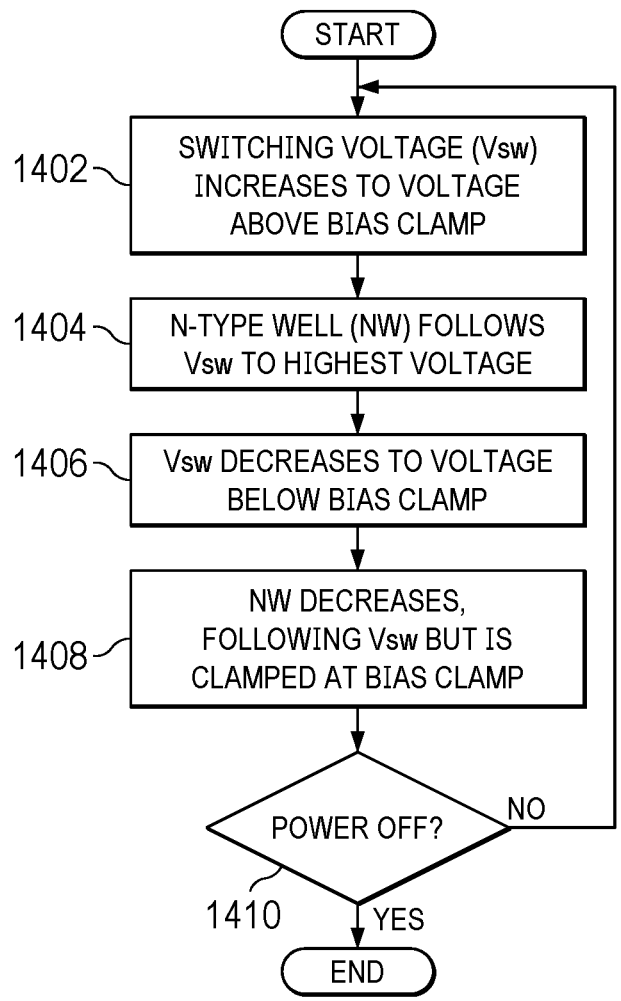
FIG. 14 is a flowchart of the operation of the example NW voltage clamp circuits of FIGS. 4A and 9-12 to control well bias in an n-type well region of a semiconductor device.

FIG. 14 is a flowchart of the operation of the example NW voltage clamp circuit 400 of FIGS. 4A and 9-12 to control well bias in an n-type well region (e.g., the NW region 152 and/or the NBL region 156) of the semiconductor device 106. At block 1402, a switching voltage (Vsw) increases to a voltage above a bias clamp voltage level. For example, the Vsw supply 508 of FIGS. 9-12 increases to a voltage above the bias clamp voltage level 422 of FIG. 4B. This increases the voltage at the drain (D) terminal of the clamp transistor 402 (FIGS. 9-12) causing the clamp transistor 402 to switch to an on state. Responsive to being in the on state, the clamp transistor 402 generates a voltage bias above the bias clamp voltage level 422 in the NBL region 156. If the bias clamp voltage level 422 is ground, the Vsw supply 508 of FIGS. 9-12 increases to a positive voltage above the bias clamp voltage level 422 to generate a positive voltage bias in the NBL region 156.

At block 1404, an NW region follows the Vsw voltage level to a highest voltage. For example, because the clamp transistor 402 is switched to an on state, the NW voltage clamp circuit 400 allows the well bias voltage in the NBL region 156 of FIGS. 9-12 to follow the Vsw voltage level. Accordingly, the well bias voltage follows the Vsw voltage level above the bias clamp voltage level 422 as shown by the NW bias voltage waveform 420 of FIG. 4B. At block 1406, the Vsw voltage level decreases to a voltage below the bias clamp voltage level 422. For example, if the bias clamp voltage level 422 is ground, the Vsw supply 508 decreases to a negative voltage below the bias clamp voltage level 422. At block 1408, the well bias voltage of the NW region (e.g., the NBL region 156) decreases, following the Vsw voltage level but is clamped at the bias clamp voltage level 422. For example, the NW voltage clamp circuit 400 clamps the well bias voltage of the NBL region 156 at the bias clamp voltage level 422, as shown by the NW bias voltage waveform 420 of FIG. 4B. The diode circuit 404 of the NW voltage clamp circuit 400 clamps the well bias voltage of the NBL region 156 at the bias clamp voltage level 422. For example, this clamping is responsive to the clamp transistor 402 turning off after the Vsw voltage level of the Vsw supply 508 decreases at the drain (D) terminal of the clamp transistor 402 below the bias clamp voltage level 422 and toward a lowest voltage (e.g., toward a negative voltage). If power to the NW voltage clamp circuit 400 is not turned off (block 1410), the process of FIG. 14 starts again at block 1402. Otherwise, the process of FIG. 14 ends.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements, or actions may be implemented by, e.g., the same entity or object. Also, although individual features may be included in different examples or claims, these may possibly be combined, and the inclusion in different examples or claims does not imply that a combination of features is not feasible and/or advantageous.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Numerical identifiers such as "first", "second", "third", etc. are used merely to distinguish between elements of substantially the same type in terms of structure and/or function. These identifiers, as used in the detailed description, do not necessarily align with those used in the claims.

A device which is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin", and "lead" are used interchangeably. Unless specifically stated to the contrary, these terms are generally used to mean an interconnection between or a terminus of a device element, a circuit element, an integrated circuit, a device or other electronics or semiconductor component.

A circuit or device which is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. While certain elements of the described examples are included in an integrated circuit and other elements are external to the integrated circuit, in other examples, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value, or, if the value is zero, a reasonable range of values around zero.

Modifications are possible in the described examples, and other examples are possible, within the scope of the claims.

From the foregoing, it will be appreciated that example systems, apparatus, articles of manufacture, and methods have been described that substantially reduce or eliminate unwanted p-n junction breakdowns and/or latchups in circuits. Such unwanted p-n junction breakdowns and/or latchups in circuits are substantially reduced or eliminated by described example PW voltage clamping circuits that control well bias voltage in p-type well regions of semiconductor devices and/or described example NW voltage clamping circuits that control well bias voltage in n-type well regions of semiconductor devices. Described systems, apparatus, articles of manufacture, and methods are accordingly directed to one or more improvement(s) in the operation of a machine such as a computer or other electronic and/or mechanical device.

The following claims are hereby incorporated into this Detailed Description by this reference. Although certain example systems, apparatus, articles of manufacture, and methods have been described herein, the scope of coverage of this patent is not limited thereto. On the contrary, this patent covers all systems, apparatus, articles of manufacture, and methods fairly falling within the scope of the claims of this patent.

What is claimed is:

1. A circuit comprising:
   a substrate including a first transistor of a gate driver output stage, the substrate including a first well region;
   a diode circuit including a first terminal and a second terminal, the first terminal coupled to a first tap of the first well region; and
   a second transistor including a first terminal, a second terminal, and a body, the first terminal of the second transistor coupled to a switching voltage terminal, and the second terminal and the body of the second transistor coupled to the first tap of the first well region and to the first terminal of the diode circuit.

2. The circuit of claim 1, wherein the first transistor includes a first terminal and a body, the first terminal and the body coupled to a bootstrap voltage terminal.

3. The circuit of claim 1, wherein the first terminal of the second transistor is coupled to a bootstrap voltage terminal via a bootstrap capacitor.

4. The circuit of claim 1, wherein the first transistor is a p-channel metal-oxide semiconductor (PMOS) transistor, the second transistor is an n-channel metal-oxide semiconductor (NMOS) transistor.

5. The circuit of claim 1, wherein a third terminal of the second transistor is coupled to ground.

6. The circuit of claim 1, comprising:
a third transistor including a first terminal, a second terminal, and a third terminal, the third terminal of the third transistor coupled to ground, the first terminal of the third transistor coupled to a gate driver voltage terminal; and
a fourth transistor including a first terminal, a second terminal, and a third terminal, the third terminal of the fourth transistor coupled to the gate driver voltage terminal, the first terminal of the fourth transistor coupled to ground, the second terminal of the fourth transistor and the second terminal of the third transistor coupled to a third terminal of the second transistor.

7. The circuit of claim 1, wherein the diode circuit is a diode-connected transistor, the second terminal of the diode circuit is a first terminal of the diode-connected transistor, the first terminal of the diode circuit is a second terminal of the diode-connected transistor coupled to a body and a third terminal of the diode-connected transistor.

8. The circuit of claim 1, comprising an isolation region between the first well region and the substrate, the isolation region including a second tap, the second tap coupled to an isolation voltage terminal.

9. The circuit of claim 1, comprising a gate driving circuit including bootstrap capacitor charging circuitry and a level shifter, the bootstrap capacitor charging circuitry coupled to a bootstrap voltage terminal, the level shifter coupled to a gate driver that includes the gate driver output stage.

10. A system comprising:
a first power transistor including a first terminal and a second terminal;
a second power transistor including a first terminal and a second terminal, the first terminal of the second power transistor connected to the second terminal of the first power transistor;
gate driver;
a level shifter; and
a voltage clamp circuit, the voltage clamp circuit including:
a diode circuit; and
a third transistor including a first terminal, a second terminal, and a body, the first terminal of the third transistor coupled to the level shifter, and the second terminal and the body of the third transistor coupled to the gate driver and to a first terminal of the diode circuit.

11. The system of claim 10, wherein the third transistor is an n-channel metal-oxide semiconductor (NMOS) transistor.

12. The system of claim 10, comprising a bootstrap capacitor including a first terminal and a second terminal, the first terminal coupled to the first terminal of the third transistor.

13. The system of claim 12, comprising a bootstrap capacitor charging circuit coupled to the second terminal of the bootstrap capacitor.

14. The system of claim 10, comprising:
a fourth transistor including a first terminal, a second terminal, and a third terminal, the third terminal of the fourth transistor coupled to ground, the first terminal of the fourth transistor coupled to a gate driver voltage terminal; and
a fifth transistor including a first terminal, a second terminal, and a third terminal, the third terminal of the fifth transistor coupled to the gate driver voltage terminal, the first terminal of the fifth transistor coupled to ground, the second terminal of the fifth transistor and the second terminal of the fourth transistor coupled to a third terminal of the third transistor.

15. The system of claim 10, comprising wherein the diode circuit is a diode-connected transistor, a second terminal of the diode circuit is a first terminal of the diode-connected transistor, the first terminal of the diode circuit is a second terminal of the diode-connected transistor coupled to a body and a third terminal of the diode-connected transistor.

16. The system of claim 10, wherein the first terminal of the third transistor is connected to the first terminal of the second power transistor and to the second terminal of the first power transistor.

17. The system of claim 10, wherein the first terminal of the third transistor is connected to a switching voltage terminal.

18. A method to dynamically control well bias, the method comprising:
after a switching voltage decreases toward a negative voltage, controlling a voltage bias in a first well region of a semiconductor to follow the switching voltage, the controlling of the voltage bias based on a voltage clamp circuit, the voltage clamp circuit including a diode circuit coupled to a transistor, a first terminal of the transistor coupled to the switching voltage, a second terminal of the transistor coupled to a first terminal of the diode circuit, the decrease of the switching voltage at the first terminal of the transistor causing the transistor to switch to an on state to generate a negative voltage bias in the first well region; and
after an increase of the switching voltage toward a positive voltage:
controlling the voltage bias in the first well region of the semiconductor based on the voltage clamp circuit to follow the switching voltage; and
clamping the voltage bias in the first well region of the semiconductor to a clamp voltage based on the transistor turning off after the switching voltage increases at the first terminal of the transistor toward the positive voltage.

19. The method of claim 18, wherein the clamp voltage is ground.

20. The method of claim 18, comprising controlling a gate voltage at a third terminal of the transistor to at least one of increase or decrease the clamp voltage.

21. The method of claim 18, wherein the clamping of the voltage bias includes preventing a junction breakdown between the first well region and a second well region of the semiconductor.

22. The method of claim 18, wherein the clamping of the voltage bias includes preventing latchup in a gate driver of a gate driving circuit.

* * * * *